US012307930B2

(12) United States Patent
Hsieh et al.

(10) Patent No.: US 12,307,930 B2
(45) Date of Patent: *May 20, 2025

(54) SCAN-TYPE DISPLAY APPARATUS CAPABLE OF SHORT CIRCUIT DETECTION, AND SCAN DRIVER THEREOF

(71) Applicant: MACROBLOCK, INC., Hsinchu (TW)

(72) Inventors: Chi-Min Hsieh, Hsinchu (TW);
Che-Wei Chang, Hsinchu (TW);
Chen-Yuan Kuo, Hsinchu (TW);
Wei-Hsiang Cheng, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 128 days.

This patent is subject to a terminal disclaimer.

(21) Appl. No.: 18/074,832

(22) Filed: Dec. 5, 2022

(65) Prior Publication Data

US 2023/0196957 A1     Jun. 22, 2023

(30) Foreign Application Priority Data

Dec. 17, 2021    (TW) ................................ 110147452

(51) Int. Cl.
*G09G 3/00*      (2006.01)
*G01R 19/10*      (2006.01)
(Continued)

(52) U.S. Cl.
CPC ............. *G09G 3/006* (2013.01); *G01R 19/10* (2013.01); *G01R 31/52* (2020.01); *G09G 3/32* (2013.01);
(Continued)

(58) Field of Classification Search
CPC .......... G09G 3/006; G09G 3/30–3216; G09G 3/3266; G09G 3/34–3426;
(Continued)

(56) References Cited

U.S. PATENT DOCUMENTS 11,875,737 B2 *   1/2024   Hsieh .................... G09G 3/006
11,929,016 B2 *   3/2024   Hsieh .................... G09G 3/006
(Continued)

FOREIGN PATENT DOCUMENTS

TW     201926299 A     7/2019
TW     202137193 A     10/2021
TW     202137196 A     10/2021

*Primary Examiner* — Keith L Crawley
(74) *Attorney, Agent, or Firm* — Akerman LLP; Peter A. Chiabotti; David J. Fernandez-Fidalgo

(57) ABSTRACT

A scan-type display apparatus includes an LED array and a scan driver. The LED array has a common cathode configuration, and includes multiple scan lines, multiple data lines and multiple LEDs. The scan driver includes multiple scan driving circuits. Each scan driving circuit includes a voltage generator and a detector. The voltage generator has an output terminal that is connected to the scan line corresponding to the scan driving circuit, and is configured to output one of a common voltage and a clamp voltage at the output terminal of the voltage generator. The detector is connected to the output terminal of the voltage generator, and generates a detection signal that indicates whether any one of the LEDs connected to the scan line corresponding to the scan driving circuit is short circuited based on a voltage at the output terminal of the voltage generator and a detection timing signal.

7 Claims, 16 Drawing Sheets

(51) Int. Cl.
*G01R 31/52* (2020.01)
*G09G 3/32* (2016.01)

(52) U.S. Cl.
CPC ............ *G09G 2310/0267* (2013.01); *G09G 2320/0233* (2013.01); *G09G 2330/021* (2013.01); *G09G 2330/08* (2013.01); *G09G 2330/12* (2013.01)

(58) Field of Classification Search
CPC ....... G09G 2300/06; G09G 2310/0202; G09G 2310/0267; G09G 2310/08; G09G 2320/0233; G09G 2330/021; G09G 2330/08; G09G 2330/12; G01R 19/10; G01R 31/2812; G01R 31/52; H10K 59/17; H10K 59/179
See application file for complete search history.

(56) References Cited

U.S. PATENT DOCUMENTS

| | | | |
|---|---|---|---|
| 11,996,037 B2 * | 5/2024 | Hsieh | G09G 3/32 |
| 2005/0110719 A1 | 5/2005 | Satoh et al. | |
| 2014/0347255 A1 * | 11/2014 | Chiu | G09G 3/32 |
| | | | 345/82 |
| 2019/0156757 A1 * | 5/2019 | Chang | G09G 3/3258 |
| 2022/0262300 A1 | 8/2022 | Hung et al. | |
| 2023/0316963 A1 * | 10/2023 | Bi | G09G 3/006 |
| | | | 345/214 |

* cited by examiner

SCAN-TYPE DISPLAY APPARATUS
CAPABLE OF SHORT CIRCUIT
DETECTION, AND SCAN DRIVER THEREOF

CROSS-REFERENCE TO RELATED APPLICATION

This application claims priority to Taiwanese Patent Application No. 110147452, filed on Dec. 17, 2021.

FIELD

The disclosure relates to display techniques, and more particularly to a scan-type display apparatus capable of short circuit detection and a scan driver thereof.

BACKGROUND

A conventional method for driving a light emitting diode (LED) display to emit light in a line scan manner can alleviate ghosting phenomenon and cross-channel coupling problems of the LED display, but would cause other problems such as short circuit caterpillar phenomenon. For each LED of the LED display, charges released by parasitic capacitance across the LED may flow through the LED, so as to cause the LED to emit light. This unexpected light emission of the LED is the so called ghosting phenomenon. For each line of the line scan of an LED array of the LED display, a dark pixel of the line may be affected by a bright pixel of the line to produce a different brightness than what would be expected. This is the so called cross-channel coupling problem. The short circuit caterpillar phenomenon includes the always bright caterpillar phenomenon and the always dark caterpillar phenomenon. A short circuit of an LED in the LED array of the LED display may cause that LED and other LEDs in the same column of the LED array to be always bright. This is the so called always bright caterpillar phenomenon. Similarly, a short circuit of an LED in the LED array of the LED display may cause that LED and other LEDs in the same column of the LED array to be always dark. This is the so called always dark caterpillar phenomenon. Therefore, the short circuit caterpillar phenomenon degrades the display quality of the LED display.

SUMMARY

Therefore, an object of the disclosure is to provide a scan-type display apparatus capable of short circuit detection and a scan driver thereof. The scan-type display apparatus can alleviate the drawback of the prior art.

According to an aspect of the disclosure, the scan-type display apparatus includes a light emitting diode (LED) array and a scan driver. The LED array has a common cathode configuration, and includes a plurality of scan lines, a plurality of data lines and a plurality of LEDs. The LEDs are arranged in a matrix that has a plurality of rows respectively corresponding to the scan lines and a plurality of columns respectively corresponding to the data lines. With respect to each of the rows, cathodes of the LEDs in the row are connected to the scan line that corresponds to the row. With respect to each of the columns, anodes of the LEDs in the column are connected to the data line that corresponds to the column. The scan driver includes a plurality of scan driving circuits that respectively correspond to the scan lines. Each of the scan driving circuits includes a voltage generator and a detector. The voltage generator has an output terminal that is connected to the scan line corresponding to the scan driving circuit, and is configured to output one of a common voltage and a clamp voltage at the output terminal of the voltage generator. The detector is connected to the output terminal of the voltage generator to receive a voltage at the output terminal of the voltage generator, further receives a detection timing signal, and generates a detection signal that indicates whether any one of the LEDs connected to the scan line corresponding to the scan driving circuit is short circuited based on the voltage at the output terminal of the voltage generator and the detection timing signal.

According to another aspect of the disclosure, the scan driver is adapted to be used in a scan-type display apparatus that includes a light emitting diode (LED) array. The LED array has a common cathode configuration, and includes a plurality of scan lines and a plurality of LEDs. Each of the LEDs is connected to a corresponding one of the scan lines. The scan driver includes a plurality of scan driving circuits that respectively correspond to the scan lines. Each of the scan driving circuits includes a voltage generator and a detector. The voltage generator has an output terminal that is connected to the scan line corresponding to the scan driving circuit, and is configured to output one of a common voltage and a clamp voltage at the output terminal of the voltage generator. The detector is connected to the output terminal of the voltage generator to receive a voltage at the output terminal of the voltage generator, further receives a detection timing signal, and generates a detection signal that indicates whether any one of the LEDs connected to the scan line corresponding to the scan driving circuit is short circuited based on the voltage at the output terminal of the voltage generator and the detection timing signal.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
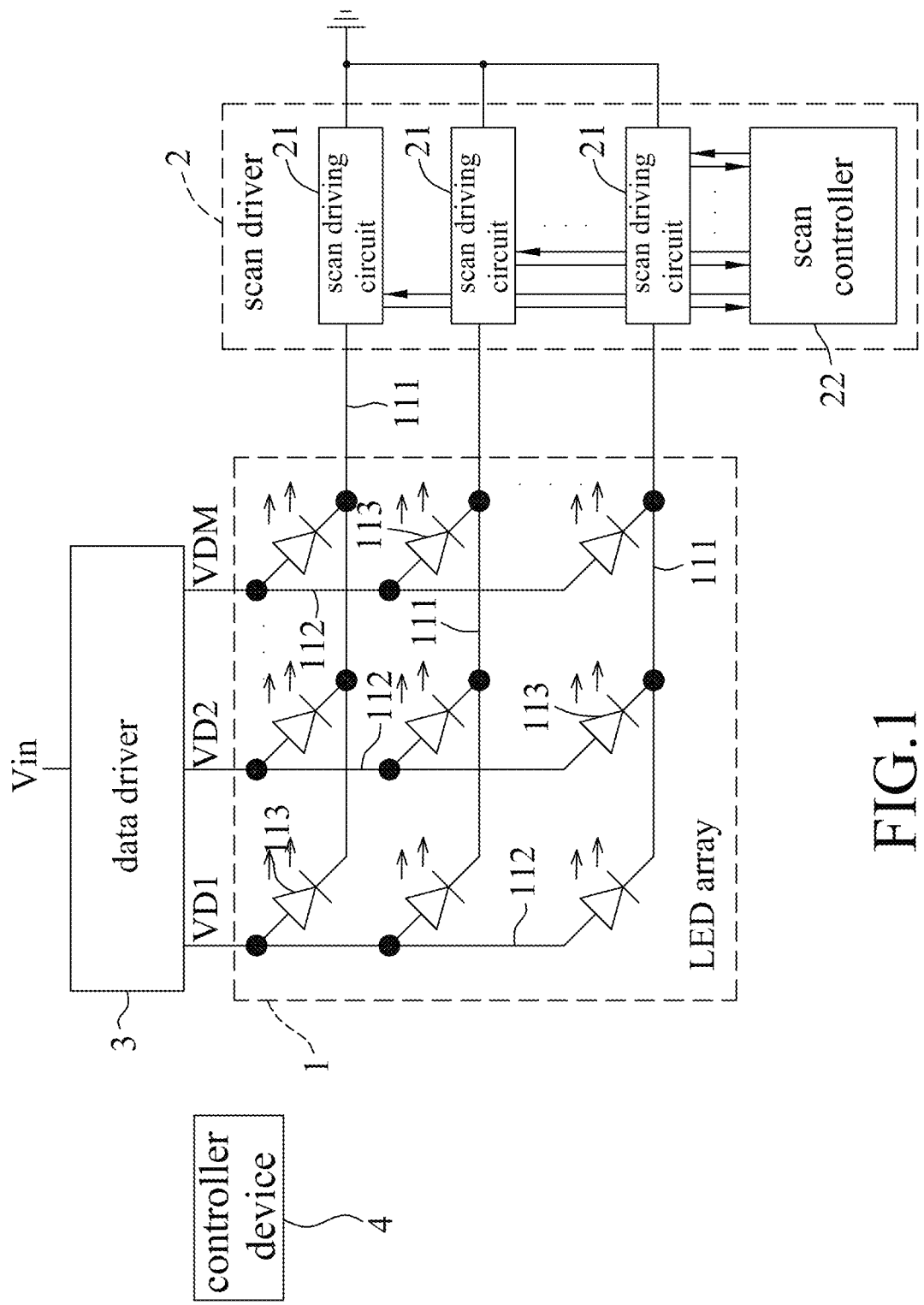
FIG. 1 is a circuit block diagram illustrating a first embodiment of a scan-type display apparatus according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
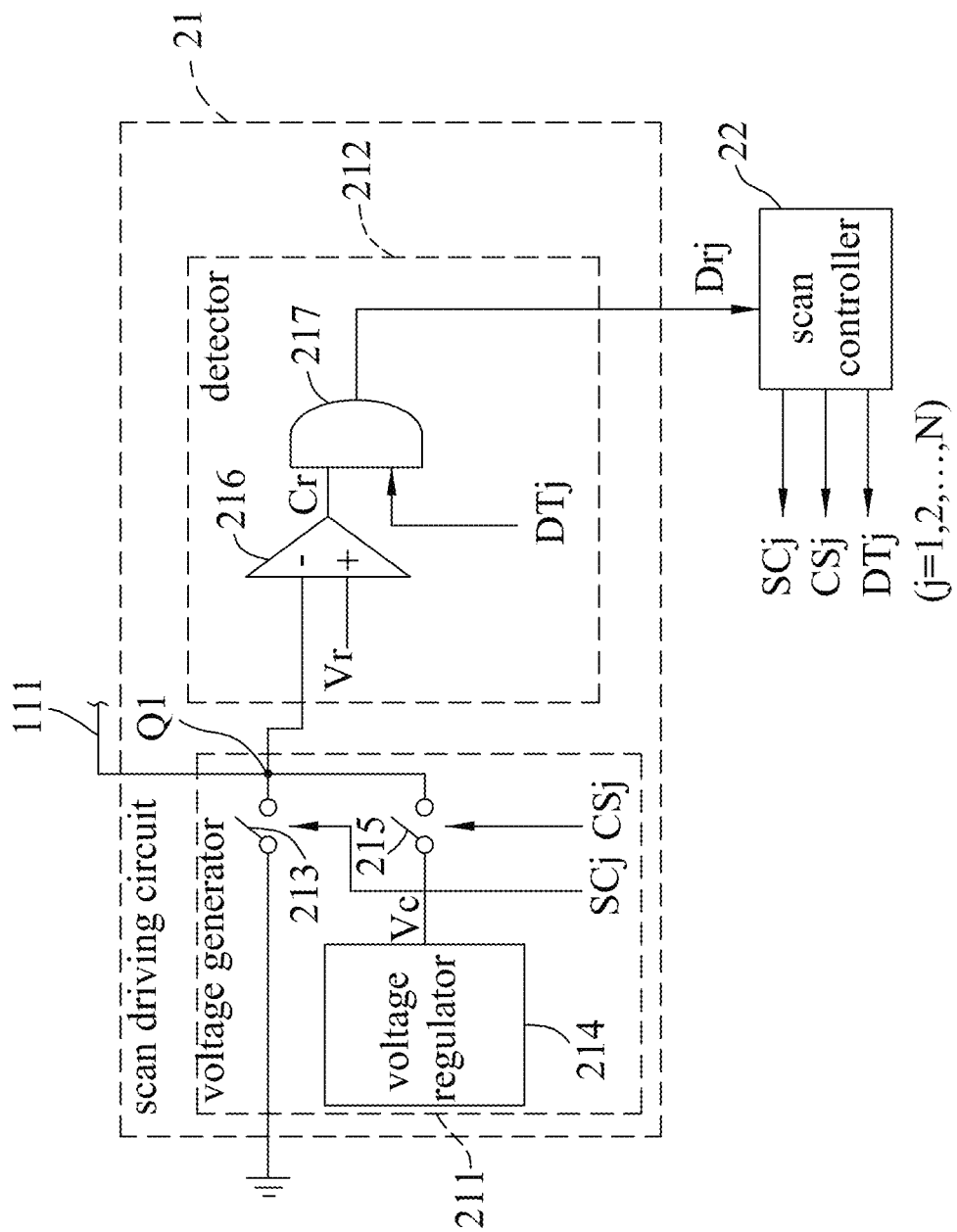
FIG. 2 is a circuit block diagram illustrating a scan driving circuit of the first embodiment.

Referring to FIGS. 1 and 2, a first embodiment of a scan-type display apparatus according to the disclosure is capable of short circuit detection, and includes a light emitting diode (LED) array 1, a scan driver 2, a data driver 3 and a controller device 4.

The LED array 1 has a common cathode configuration, and includes a number (N) of scan lines 111, a number (M) of data lines 112 and a number (N×M) of LEDs 113, where N≥2 and M≥2. The LEDs 113 are arranged in a matrix that has a number (N) of rows respectively corresponding to the scan lines 111 and a number (M) of columns respectively corresponding to the data lines 112. With respect to each of the rows, cathodes of the LEDs 113 in the row are connected to the scan line 111 that corresponds to the row. With respect to each of the columns, anodes of the LEDs 113 in the column are connected to the data line 112 that corresponds to the column. For illustration purposes, in this embodiment, the LEDs 113 in an $n^{th}$ one of the rows is adjacent to the LEDs 113 in an $(n-1)^{th}$ one of the rows, and the LEDs 113 in an $m^{th}$ one of the columns is adjacent to the LEDs 113 in an $(m-1)^{th}$ one of the columns, where 2≤n≤N and 2≤m≤M.

The scan driver 2 includes a number (N) of scan driving circuits 21 and a scan controller 22. The scan driving circuits 21 respectively correspond to the scan lines 111. Each of the scan driving circuits 21 includes a voltage generator 211 and a detector 212.

With respect to each of the scan driving circuits 21, the voltage generator 211 has an output terminal (Q1) that is connected to the corresponding scan line 111, and is configured to output one of a common voltage (e.g., a ground voltage) and a clamp voltage (Vc) at the output terminal (Q1) of the voltage generator 211. The clamp voltage (Vc) is used to eliminate ghosting phenomenon and cross-channel coupling problems of the LED array 1, and is known to those skilled in the art, so details of the clamp voltage (Vc) are omitted herein for the sake of brevity.

In this embodiment, with respect to each of the scan driving circuits 21, the voltage generator 211 includes a scan switch 213, a voltage regulator 214 and a clamp switch 215. The scan switch 213 has a first terminal that receives the common voltage, a second terminal that is connected to the output terminal (Q1) of the voltage generator 211, and a control terminal that receives a scan signal (SCj). The scan switch 213 transitions between conduction and non-conduction based on the scan signal (SCj), and, when conducting, permits transmission of the common voltage therethrough to the output terminal (Q1) of the voltage generator 211. The voltage regulator 214 generates the clamp voltage (Vc). The clamp switch 215 has a first terminal that is connected to the voltage regulator 214 to receive the clamp voltage (Vc), a second terminal that is connected to the output terminal (Q1) of the voltage generator 211, and a control terminal that receives a clamp signal (CSj). The clamp switch 215 transitions between conduction and non-conduction based on the clamp signal (CSj), and, when conducting, permits transmission of the clamp voltage (Vc) therethrough to the output terminal (Q1) of the voltage generator 211.

With respect to each of the scan driving circuits 21, the detector 212 is connected to the output terminal (Q1) of the voltage generator 211 to receive a voltage at the output terminal (Q1) of the voltage generator 211, further receives a detection timing signal (DTj), and generates a detection signal (Drj) that indicates whether any one of the LEDs 113 connected to the corresponding scan line 111 is short circuited based on the voltage at the output terminal (Q1) of the voltage generator 211 and the detection timing signal (DTj).

In this embodiment, with respect to each of the scan driving circuits 21, the detector 212 includes a comparator 216 and a logic gate 217. The comparator 216 has a first input terminal (e.g., an inverting input terminal) that is connected to the output terminal (Q1) of the voltage generator 211 to receive the voltage at the output terminal (Q1) of the voltage generator 211, a second input terminal (e.g., a non-inverting input terminal) that receives a predetermined reference voltage (Vr), and an output terminal that outputs a comparison signal (Cr). The comparison signal (Cr) indicates a result of comparison between the voltage at the output terminal (Q1) of the voltage generator 211 and the predetermined reference voltage (Vr). The logic gate 217 (e.g., an AND gate) has a first input terminal that is connected to the output terminal of the comparator 216 to receive the comparison signal (Cr), a second input terminal that receives the detection timing signal (DTj), and an output terminal that provides the detection signal (Drj).

For illustration purposes, in this embodiment, the output terminal (Q1) the voltage generator 211 of a $j^{th}$ one of the scan driving circuits 21 is connected to the scan line 111 that is connected to the LEDs 113 in a $j^{th}$ one of the rows; the scan switch 213 and the clamp switch 215 of the voltage generator 211 of the $j^{th}$ one of the scan driving circuits 21 are respectively controlled by the scan signal (SCj) and the clamp signal (CSj); and the logic gate 217 of the detector 212 of the $j^{th}$ one of the scan driving circuits 21 receives the detection timing signal (DTj) and provides the detection signal (Drj), where 1≤j≤N.

In this embodiment, with respect to each of the scan driving circuits 21, the scan controller 22 is connected to the second input terminal of the logic gate 217, the control terminal of the scan switch 213 and the control terminal of the clamp switch 215, receives the detection signal (Drj) generated by the detector 212, and generates the detection timing signal (DTj) to be received by the second input terminal of the logic gate 217, the scan signal (SCj) to be received by the control terminal of the scan switch 213, and the clamp signal (CSj) to be received by the control terminal of the clamp switch 215, with the clamp signal (CSj) dependent on the detection signal (Drj) received.

The data driver 3 is connected to the data lines 112, receives an input voltage (Vin), and provides a plurality of drive current signals respectively to the data lines 112. The drive current signals are sourced from a power supply that provides the input voltage (Vin). The controller device 4 generates parameter settings and grayscale data that are required by the scan driver 2 and the data driver 3 to properly drive the LED array 1. The operations of the data driver 3 and the controller device 4 are known to those skilled in the art, and the salient features of the disclosure do not reside in these operations, so details of these operations are omitted herein for the sake of brevity.

Figure 3:
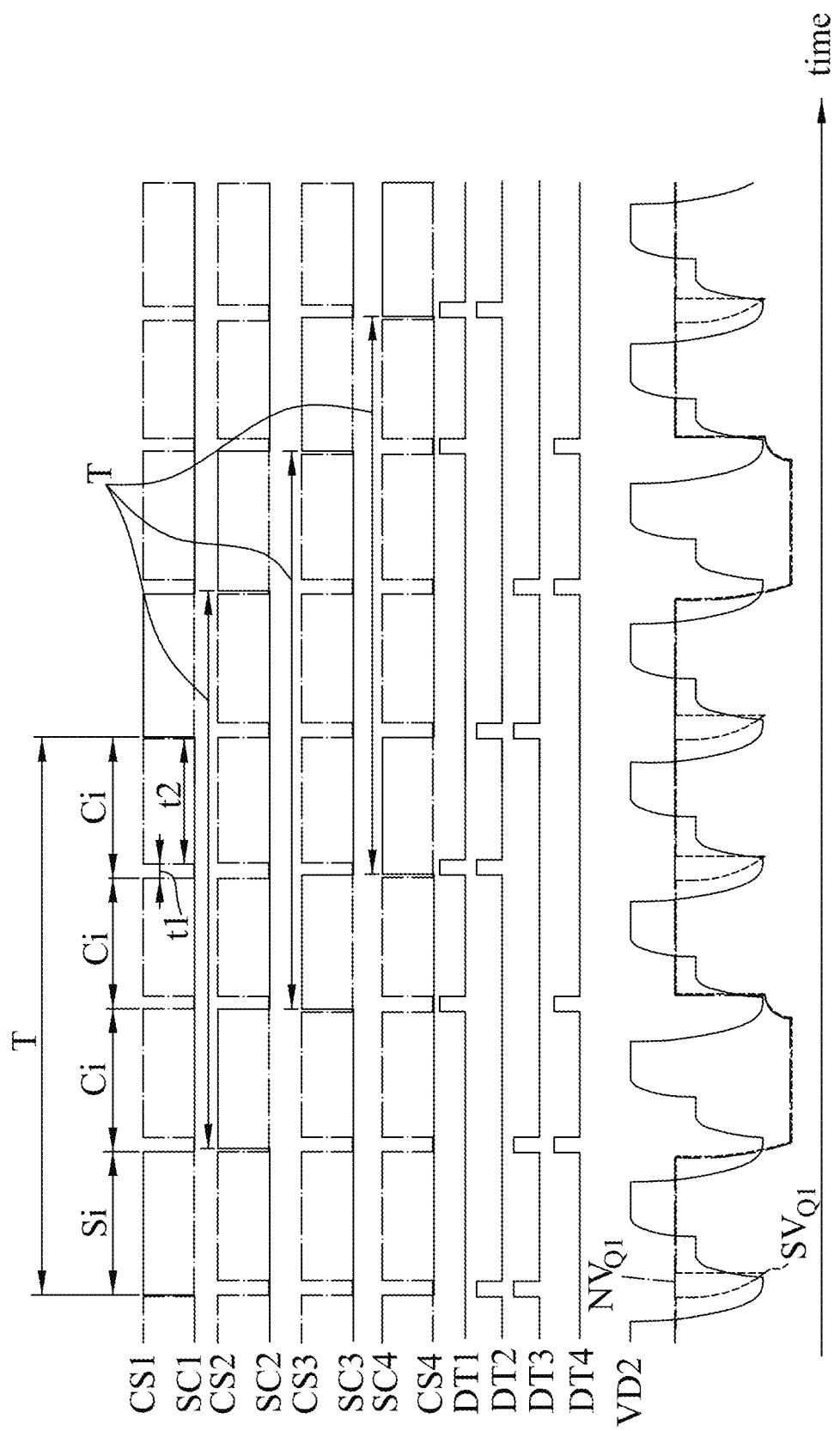
FIGS. 3 and 4 are timing diagrams illustrating operations of the first embodiment.
Figure 4:
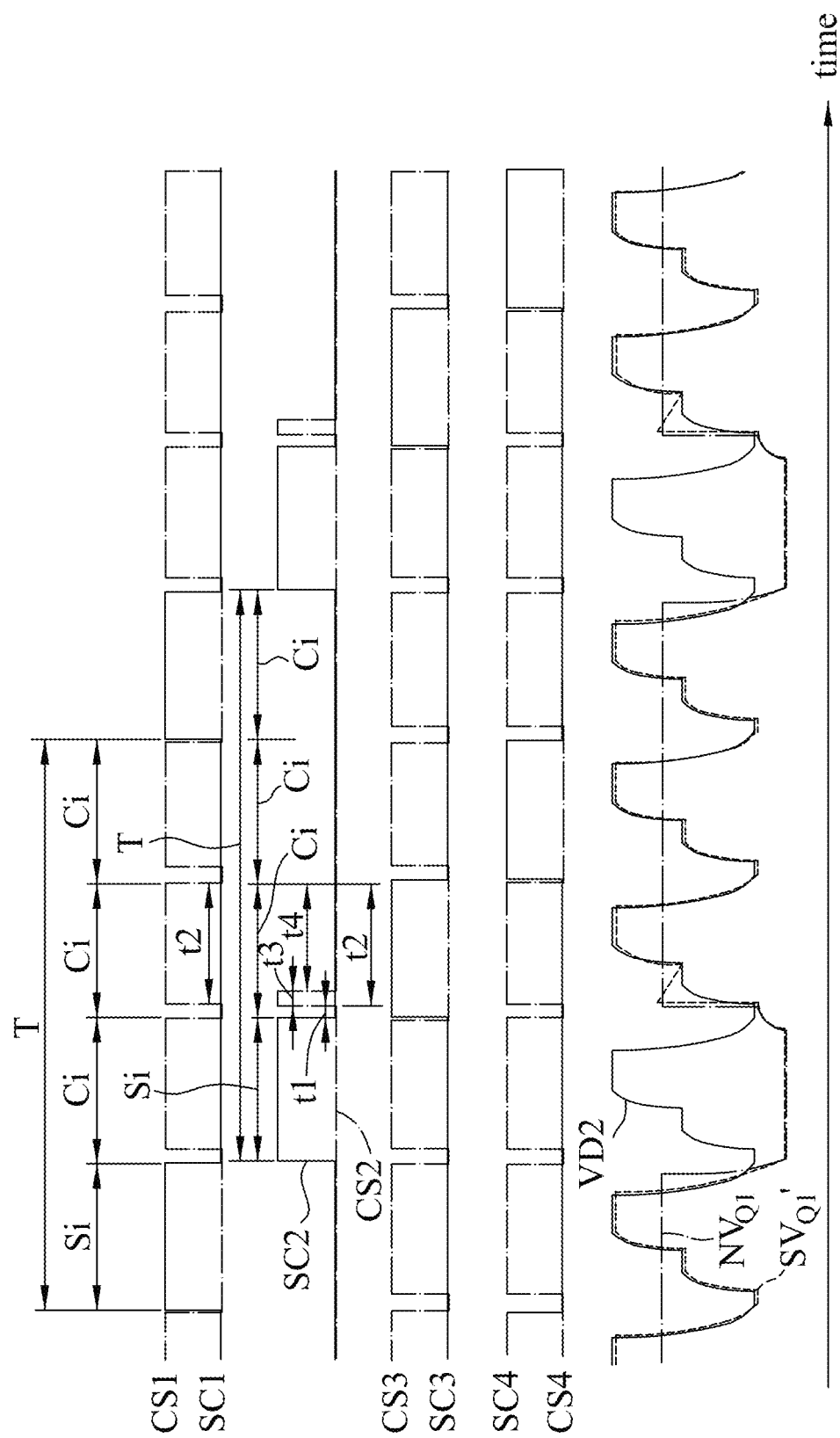

FIGS. 3 and 4 illustrate operations of the scan-type display apparatus of this embodiment in a scenario where the LED array 1 includes four scan lines 111, four data lines 112 and sixteen LEDs 113 and the scan driver 2 includes four scan driving circuits 21 (i.e., M=N=4). Referring to FIGS. 1 to 4, in this embodiment, with respect to each of the scan driving circuits 21, the scan driving circuit 21 has an operation cycle (T) that is repeated and that includes a scan time interval (Si) and a number (N−1) of clamp time intervals (Ci) (i.e., three clamp time intervals (Ci) in this embodiment) after the scan time interval (Si). Each of the clamp time intervals (Ci) includes a first clamp time segment (t1), and a second clamp time segment (t2) that comes after/follows the first clamp time segment (t1) and that includes a first clamp time slice (t3) and a second clamp time slice (t4) coming after/following the first clamp time slice (t3). The scan signal (SCj) is at a voltage level (e.g., a logic "1" voltage level) corresponding to conduction of the scan switch 213 during the scan time interval (Si), and is at a voltage level (e.g., a logic "0" voltage level) corresponding to non-conduction of the scan switch 213 during the clamp time intervals (Ci). The detection timing signal (DTj) is at a voltage level (e.g., a logic "1" voltage level) that corresponds to a state where the detector 212 detects whether any one of the LEDs 113 connected to the corresponding scan line 111 is short circuited during the first clamp time segments (t1) of a second one to an $(N-1)^{th}$ one (i.e., a third one in this embodiment) of the clamp time intervals (Ci), and is at a voltage level (e.g., a logic "0" voltage level) that corresponds to a state where the detector 212 does not perform detection during other times of the operation cycle (T). As shown in FIG. 3, when the detection signal (Drj) indicates that none of the LEDs 113 connected to the corresponding scan line 111 is short circuited, the clamp signal (CSj) is at a voltage level (e.g., a logic "0" voltage level) corresponding to non-conduction of the clamp switch 215 during the scan time interval (Si) and the first clamp time segments (t1) of the clamp time intervals (Ci), and is at a voltage level (e.g., a logic "1" voltage level) corresponding to conduction of the clamp switch 215 during the second clamp time segments (t2) of the clamp time intervals (Ci). As shown in FIG. 4, when the detection signal (Drj) indicates that at least one of the LEDs 113 connected to the corresponding scan line 111 is short circuited, the clamp signal (CSj) is at the voltage level (i.e., the logic "1" level) corresponding to conduction of the clamp switch 215 during the first clamp time slice (t3) of the second clamp time segment (t2) of a first one of the clamp time intervals (Ci), and is at the voltage level (i.e., the logic "0" voltage level) corresponding to non-conduction of said clamp switch 215 during other times of the operation cycle (T). Therefore, the voltage generator 211 outputs the common voltage at the output terminal (Q1) during the scan time interval (Si), outputs the clamp voltage (Vc) at the output terminal (Q1) during the second clamp time segments (t2) of the clamp time intervals (Ci) when the detection signal (Drj) indicates that none of the LEDs 113 connected to the corresponding scan line 111 is short circuited, and outputs the clamp voltage (Vc) at the output terminal (Q1) during the first clamp time slice (t3) of the second clamp time segment (t2) of the first one of the clamp time intervals (Ci) when the detection signal (Drj) indicates that at least one of the LEDs 113 connected to the corresponding scan line 111 is short circuited; and the detector 212 detects whether any one of the LEDs 113 connected to the corresponding scan line 111 is short circuited during the first clamp time segments (t1) of the second one to the $(N-1)^{th}$ one (i.e., the third one in this embodiment) of the clamp time intervals (Ci).

In this embodiment, the scan time interval (Si) of an $n^{th}$ one of the scan driving circuits 21 is concurrent with a first one of the clamp time intervals (Ci) of an $(n-1)^{th}$ one of the scan driving circuits 21, and an $i^{th}$ one of the clamp time intervals (Ci) of the $n^{th}$ one of the scan driving circuits 21 is concurrent with an $(i+1)^{th}$ one of the clamp time intervals (Ci) of the $(n-1)^{th}$ one of the scan driving circuits 21, where $2 \leq n \leq N$ (i.e., $2 \leq n \leq 4$ in this embodiment) and $1 \leq i \leq N-2$ (i.e., $1 \leq i \leq 2$ in this embodiment). Therefore, the LED array 1 emits light in a line scan manner.

With respect to a second one of the scan driving circuits 21, when the clamp signal (CS2) has a waveform as shown in FIG. 3, the voltage at the output terminal (Q1) of the voltage generator 211 has a waveform ($NV_{Q1}$) if none of the LEDs 113 in a second one of the rows is short circuited, and has a waveform ($SV_{Q1}$) only if the LED 113 in the second one of the rows and a second one of the columns is short circuited. In this case, where the LED 113 in the second one of the rows and the second one of the columns is short circuited, the voltage at the output terminal (Q1) of the voltage generator 211, because it is affected by a voltage (VD2) at the data line 112 connected to the LEDs 113 in the second one of the columns, is smaller in magnitude during the first clamp time segments (t1) of the second one to the $(N-1)^{th}$ one (i.e., the third one in this embodiment) of the clamp time intervals (Ci) when compared to the situation where none of the LEDs 113 in the second one of the rows is short circuited. Additionally, in this case, the voltage at the output terminal (Q1) of the voltage generator 211 also has a valley magnitude during these first clamp time segments (t1) that is smaller than a magnitude of the predetermined reference voltage (Vr), and as a consequence, the detection signal (Dr2) is at a logic "1" voltage level during portions of these first clamp time segments (t1) and is at a logic "0" voltage level during other times of the operation period (T), so as to indicate that at least one of the LEDs 113 in the second one of the rows is shorted circuited. When the clamp signal (CS2) has a waveform as shown in FIG. 4, the voltage at the output terminal (Q1) of the voltage generator 211 will have a waveform ($SV_{Q1}'$) if only the LED 113 in the second one of the rows and the second one of the columns is short circuited. In this case, the voltage at the output terminal (Q1) of the voltage generator 211 and the voltage (VD2) are not affected by the clamp voltage (Vc) and are substantially equal to each other in magnitude during the second clamp time slice (t4) of the second clamp time segment (t2) of the first one of the clamp time intervals (Ci) and during the second one to the $(N-1)^{th}$ one (i.e., the third one in this embodiment) of the clamp time intervals (Ci), and as a consequence, the LEDs 113 in the second one of the columns would not be always bright or always dark, so as to prevent the occurrence of the short circuit caterpillar phenomenon in the LED array 1.

Figure 5:
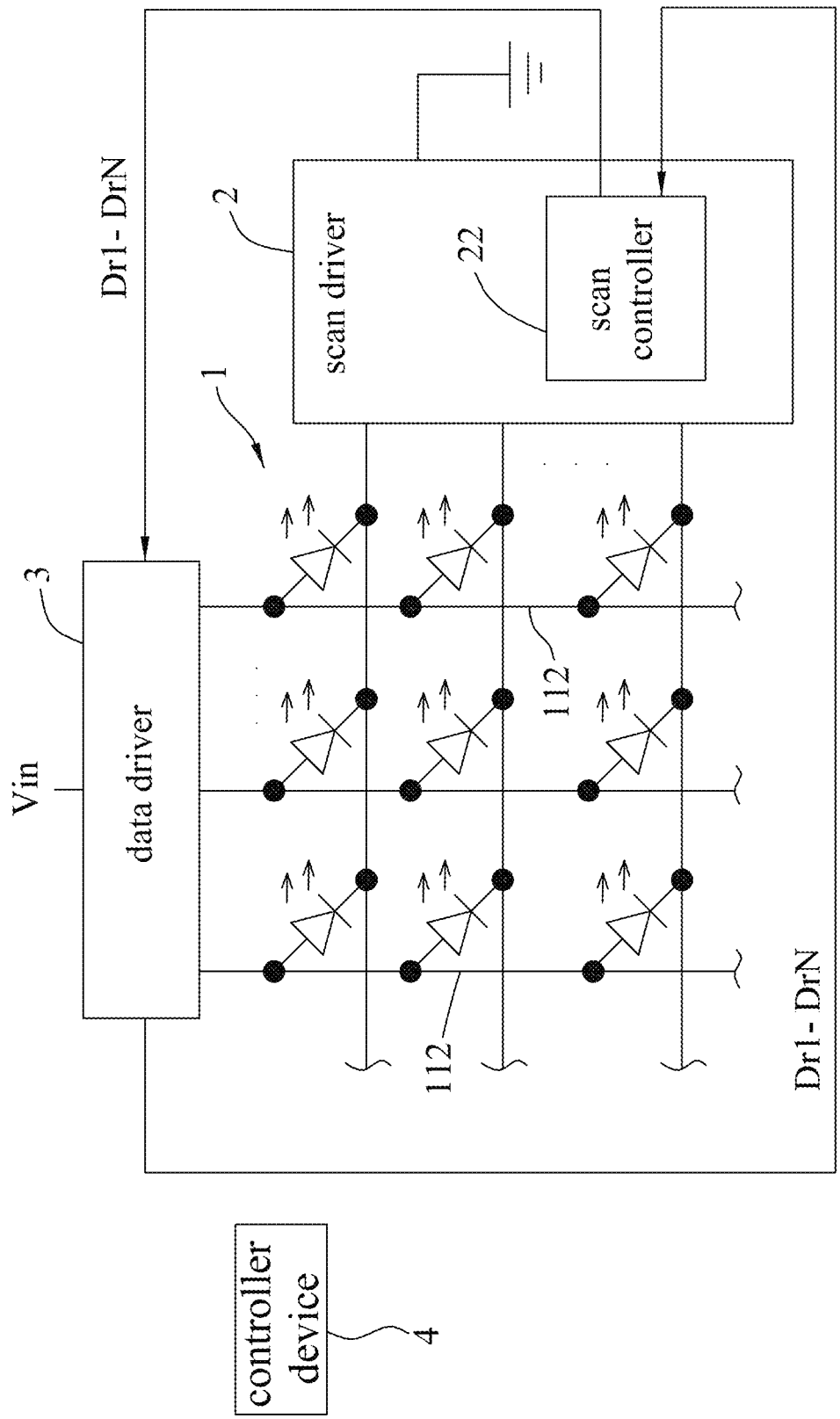
FIGS. 5 to 14 are circuit block diagrams respectively illustrating second to eleventh embodiments of the scan-type display apparatus according to the disclosure.

Referring to FIGS. 1, 2 and 5, a second embodiment of the scan-type display apparatus according to the disclosure is similar to the first embodiment, but differs from the first embodiment in what will be described below.

In the second embodiment, the data driver 3 is further connected to the scan controller 22. The scan controller 22 outputs the detection signals (Dr1-DrN) respectively received from the scan driving circuits 21. The data driver 3 receives the detection signals (Dr1-DrN) outputted by the scan controller 22, and outputs the detection signals (Dr1-DrN) received from the scan controller 22. The scan controller 22 receives the detection signals (Dr1-DrN) outputted by the data driver 3, and, with respect to each of the scan driving circuits 21, generates the clamp signal (CSj) based on the detection signal (Drj) that is received from the data driver 3 and that is from the detection signal (Drj) generated by the scan driving circuit 21, instead of the detection signal (Drj) that is received from the scan driving circuit 21.

Figure 6:
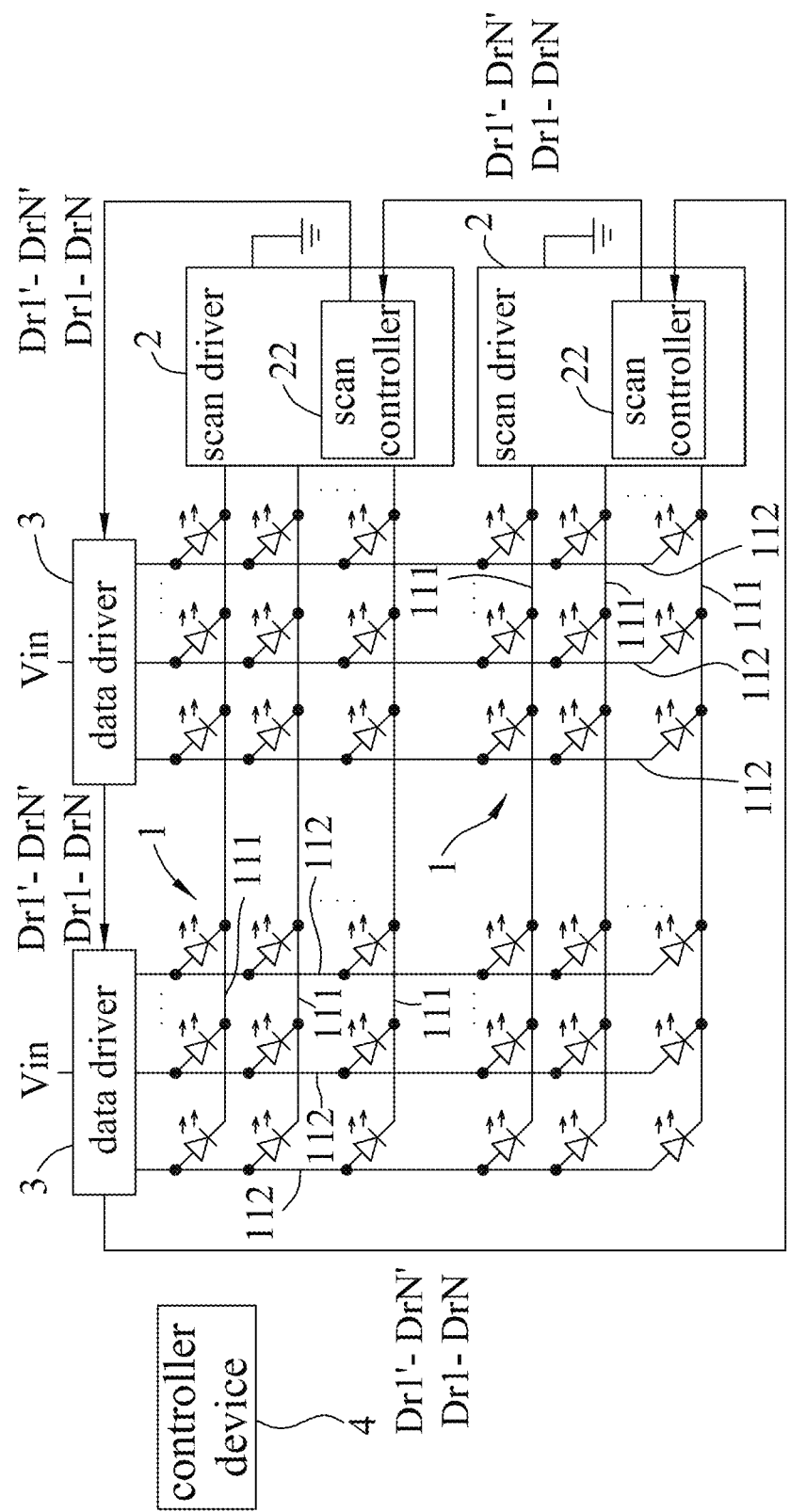

Referring to FIGS. 1, 2 and 6, a third embodiment of the scan-type display apparatus according to the disclosure is similar to the first embodiment, but differs from the first embodiment in what will be described below.

In the third embodiment, the scan-type display apparatus includes a number (R) of scan drivers 2, a number (S) of data drivers 3 and a number (R×S) of LED arrays 1, where R≥2 and S≥2. The LED arrays 1 are arranged in a matrix that has a number (R) of rows respectively corresponding to the scan drivers 2 and a number (S) of columns respectively corresponding to the data drivers 3. With respect to each of the rows of the LED arrays 1, the output terminals (Q1) of the voltage generators 211 of the scan driving circuits 21 of the corresponding scan driver 2 are respectively connected to the scan lines 111 of each of the LED arrays 1 in the row. With respect to each of the columns of the LED arrays 1, the corresponding data driver 2 is connected to the data lines 112 of each of the LED arrays 1 in the column. The scan controllers 22 of the scan drivers 2 are in a cascade connection. The data drivers 3 are in a cascade connection. The scan controller 22 of a first one of the scan drivers 2 is connected to an $S^{th}$ one of the data drivers 3. The scan controller 22 of an $R^{th}$ one of the scan drivers 2 is connected to a first one of the data drivers 3. The scan controller 22 of the first one of the scan drivers 2 outputs the detection signals respectively received from the scan driving circuits 21 of the first one of the scan drivers 2. The scan controller 22 of an $r^{th}$ one of the scan drivers 2 outputs the detection signals respectively received from the scan driving circuits 21 of the $r^{th}$ one of the scan drivers 2 and the detection signals received from the scan controller 22 of an $(r-1)^{th}$ one of the scan drivers 2, where $2 \leq r \leq R$. The first one of the data drivers 3 receives the detection signals outputted by the scan controller 22 of the $R^{th}$ one of the scan drivers 2, and outputs the detection signals received from the scan controller 22 of the $R^{th}$ one of the scan drivers 2. An $s^{th}$ one of the data drivers 3 receives the detection signals outputted by an $(s-1)^{th}$ one of the data drivers 3, and outputs the detection signals received from the $(s-1)^{th}$ one of the data drivers 3, where $2 \leq s \leq S$. The scan controller 22 of the first one of the scan drivers 2 receives the detection signals outputted by the $S^{th}$ one of the data drivers 3, generates the clamp signals (CS1-CSN) based on the detection signals that are received from the $S^{th}$ one of the data drivers 3 and that are from the detection signals generated by the scan driving circuits 21 of the first one of the scan drivers 2, and outputs the detection signals that are received from the $S^{th}$ one of the data drivers 3 and that are from the detection signals generated by the scan driving circuits 21 of a second one to the $S^{th}$ one of the scan drivers 2. The scan controller 22 of an $x^{th}$ one of the scan drivers 2 receives the detection signals outputted by the scan controller 22 of an $(x-1)^{th}$ one of the scan drivers 2, generates the clamp signals (CS1-CSN) based on the detection signals that are received from the scan controller 22 of the $(x-1)^{th}$ one of the scan drivers 2 and that are from the detection signals generated by the scan driving circuits 21 of the $x^{th}$ one of the scan drivers 2, and outputs the detection signals that are received from the scan controller 22 of the $(x-1)^{th}$ one of the scan drivers 2 and that are from the detection signals generated by the scan driving circuits 21 of an $(x+1)^{th}$ one to the $S^{th}$ one of the scan drivers 2, where $2 \leq x \leq S-1$. The scan controller 22 of the $S^{th}$ one of the scan drivers 2 receives the detection signals outputted by the scan controller 22 of the $(S-1)^{th}$ one of the scan drivers 2, and generates the clamp signals (CS1-CSN) based on the detection signals that are received from the scan controller 22 of the $(S-1)^{th}$ one of the scan drivers 2 and that are from the detection signals generated by the scan driving circuits 21 of the $S^{th}$ one of the scan drivers 2.

FIG. 6 depicts an example where R=S=2. In this example, the scan controller 22 of the first one of the scan drivers 2 outputs the detection signals (Dr1'-DrN') respectively received from the scan driving circuits 21 of the first one of the scan drivers 2. The scan controller 22 of the second one of the scan drivers 2 receives the detection signals (Dr1'-DrN') outputted by the scan controller 22 of the first one of the scan drivers 2, and outputs the detection signals (Dr1-DrN) respectively received from the scan driving circuits 21 of the second one of the scan drivers 2 and the detection signals (Dr1'-DrN') received from the scan controller 22 of the first one of the scan drivers 2. The first one of the data drivers 3 receives the detection signals (Dr1-DrN, Dr1'-DrN') outputted by the scan controller 22 of the second one of the scan drivers 2, and outputs the detection signals (Dr1-DrN, Dr1'-DrN') received from the scan controller 22 of the second one of the scan drivers 2. The second one of the data drivers 3 receives the detection signals (Dr1-DrN, Dr1'-DrN') outputted by the first one of the data drivers 3, and outputs the detection signals (Dr1-DrN, Dr1'-DrN') received from the first one of the data drivers 3. The scan controller 22 of the first one of the scan drivers 2 receives the detection signals (Dr1-DrN, Dr1'-DrN') outputted by the second one of the data drivers 3, generates the clamp signals (CS1-CSN) based on the detection signals (Dr1'-DrN') that are received from the second one of the data drivers 3 and that are from the detection signals (Dr1'-DrN') generated by the scan driving circuits 21 of the first one of the scan drivers 2, and outputs the detection signals (Dr1-DrN) that are received from the second one of the data drivers 3 and that are from the detection signals (Dr1-DrN) generated by the scan driving circuits 21 of the second one of the scan drivers 2. The scan controller 22 of the second one of the scan drivers 2 receives the detection signals (Dr1-DrN) outputted by the scan controller 22 of the first one of the scan drivers 2, and generates the clamp signals (CS1-CSN) based on the detection signals (Dr1-DrN) that are received from the scan controller 22 of the first one of the scan drivers 2 and that are from the detection signals (Dr1-DrN) generated by the scan driving circuits 21 of the second one of the scan drivers 2.

Figure 7:
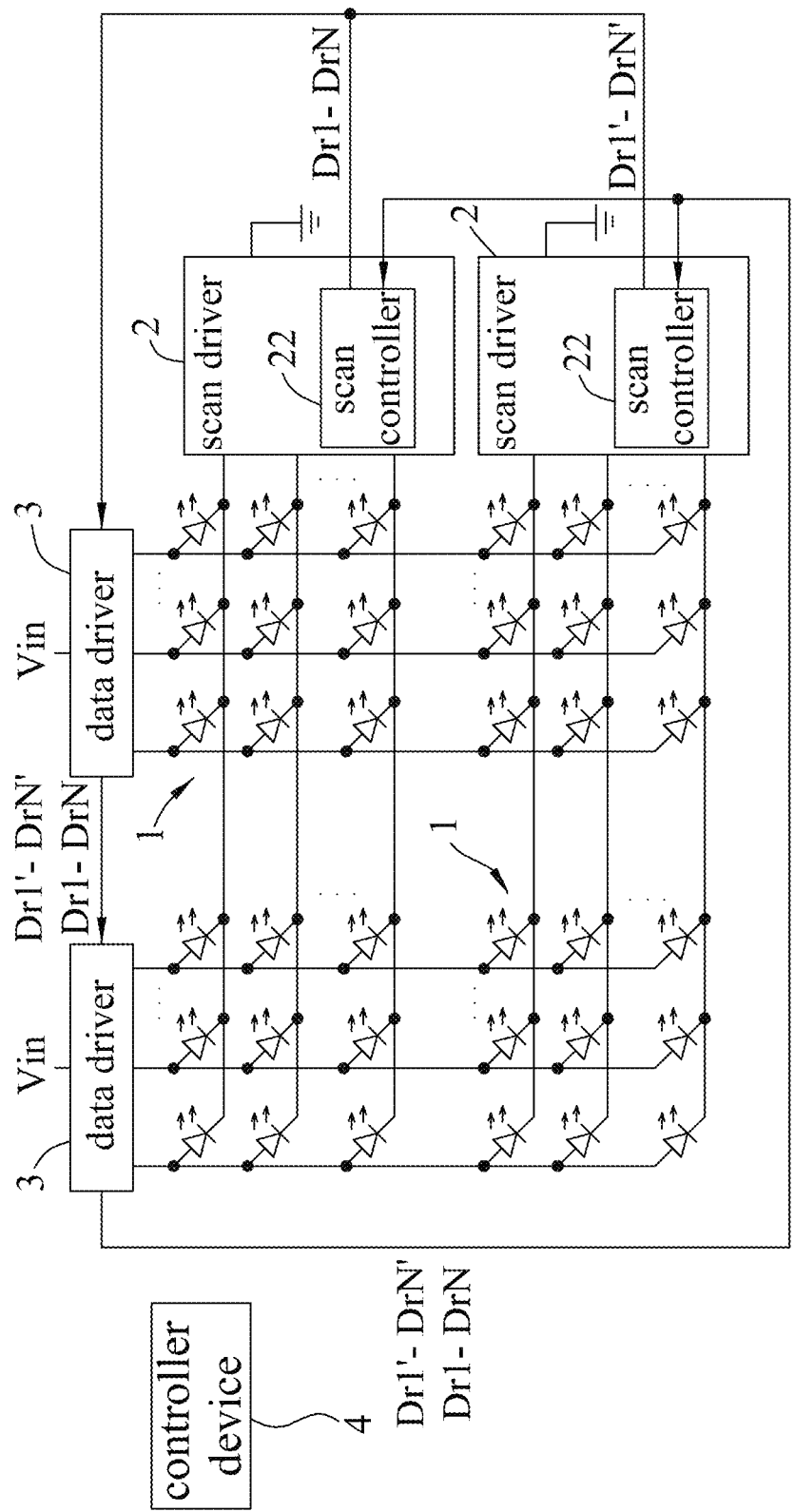

Referring to FIGS. 1, 2 and 7, a fourth embodiment of the scan-type display apparatus according to the disclosure is similar to the third embodiment as shown in FIG. 6, but differs from the third embodiment in what will be described below.

In the fourth embodiment, the scan controllers 22 of the scan drivers 2 are not in a cascade connection. The scan controller 22 of each of the scan drivers 2 is connected to the first one and the $S^{th}$ one of the data drivers 3, and outputs the detection signals respectively received from the scan driving circuits 21 of the scan driver 2. The first one of the data drivers 3 receives the detection signals outputted by the scan controllers 22 of the scan drivers 2, and outputs the detection signals received from the scan controllers 22 of the scan drivers 2. The $s^{th}$ one of the data drivers 3 receives the detection signals outputted by the $(s-1)^{th}$ one of the data drivers 3, and outputs the detection signals received from the $(s-1)^{th}$ one of the data drivers 3, where $2 \leq s \leq S$. The scan controller 22 of each of the scan drivers 2 receives the detection signals that are outputted by the $S^{th}$ one of the data drivers 3 and that are from the detection signals generated by the scan driving circuits 21 of the scan driver 2, and generates the clamp signals (CS1-CSN) based on the detection signals thus received.

FIG. 7 depicts an example where R=S=2. In this example, the scan controller 22 of the first one of the scan drivers 2 outputs the detection signals (Dr1'-DrN') respectively received from the scan driving circuits 21 of the first one of the scan drivers 2. The scan controller 22 of the second one of the scan drivers 2 outputs the detection signals (Dr1-DrN) respectively received from the scan driving circuits 21 of the second one of the scan drivers 2. The first one of the data drivers 3 receives the detection signals (Dr1-DrN, Dr1'-DrN') outputted by the scan controllers 22 of the scan drivers 2, and outputs the detection signals (Dr1-DrN, Dr1'-DrN') received from the scan controllers 22 of the scan drivers 2. The second one of the data drivers 3 receives the detection signals (Dr1-DrN, Dr1'-DrN') outputted by the first one of the data drivers 3, and outputs the detection signals (Dr1-

DrN, Dr1'-DrN') received from the first one of the data drivers 3. The scan controller 22 of the first one of the scan drivers 2 receives the detection signals (Dr1'-DrN') that are outputted by the second one of the data drivers 3 and that are from the detection signals (Dr1'-DrN') generated by the scan driving circuits 21 of the first one of the scan drivers 2, and generates the clamp signals (CS1-CSN) based on the detection signals (Dr1'-DrN') thus received. The scan controller 22 of the second one of the scan drivers 2 receives the detection signals (Dr1-DrN) that are outputted by the second one of the data drivers 3 and that are from the detection signals (Dr1-DrN) generated by the scan driving circuits 21 of the second one of the scan drivers 2, and generates the clamp signals (CS1-CSN) based on the detection signals (Dr1-DrN) thus received.

Figure 8:
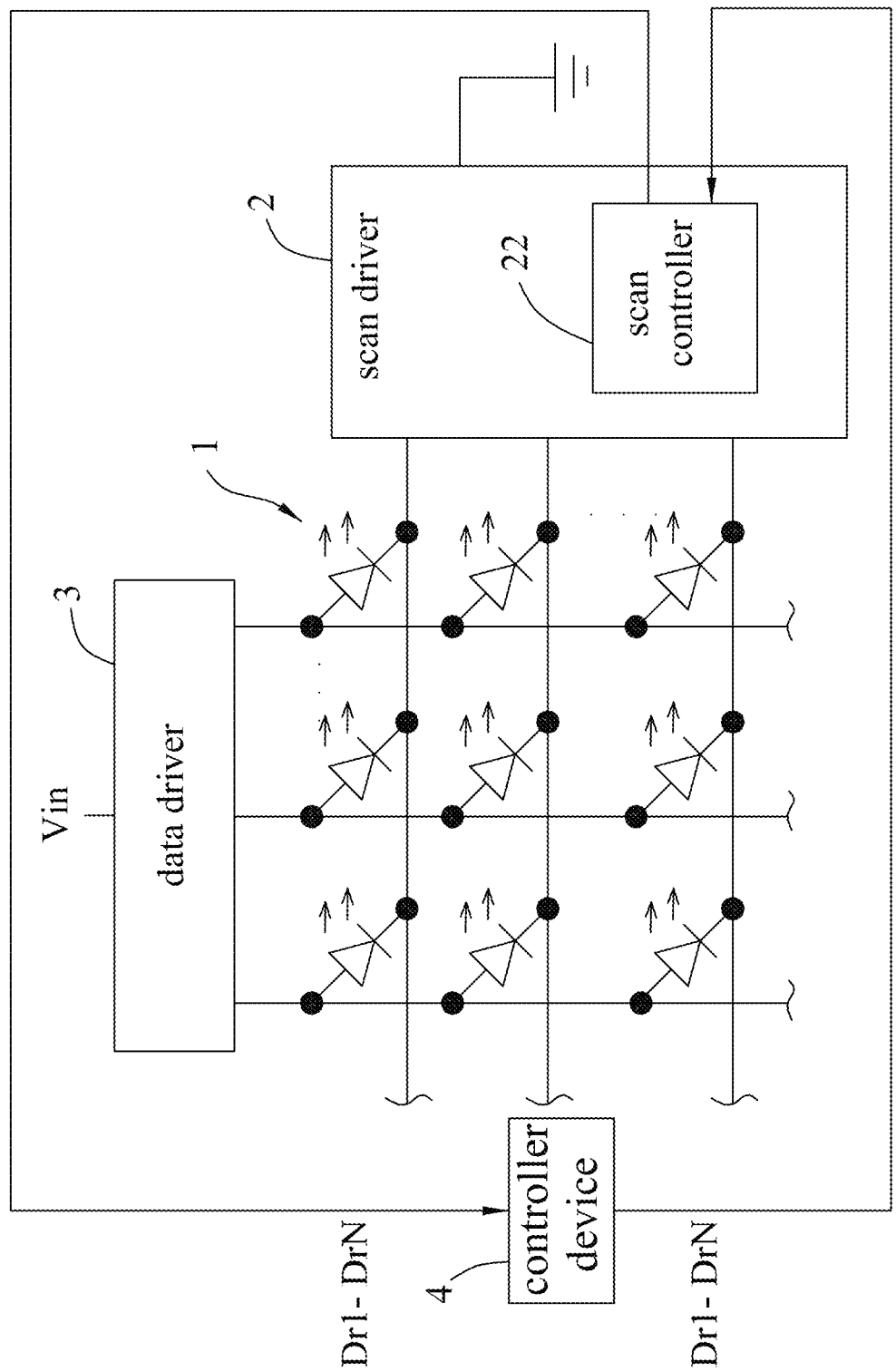

Referring to FIGS. 1, 2 and 8, a fifth embodiment of the scan-type display apparatus according to the disclosure is similar to the second embodiment as shown in FIG. 5, but differs from the second embodiment in what will be described below.

In the fifth embodiment, the scan controller 22 is connected to the controller device 4, instead of to the data driver 3. The controller device 4 receives the detection signals (Dr1-DrN) outputted by the scan controller 22, and outputs the detection signals (Dr1-DrN) received from the scan controller 22. The scan controller 22 receives the detection signals (Dr1-DrN) outputted by the controller device 4, and, with respect to each of the scan driving circuits 21, generates the clamp signal (CSj) based on the detection signal (Drj) that is received from the controller device 4 and that is from the detection signal (Drj) generated by the scan driving circuit 21.

Figure 9:
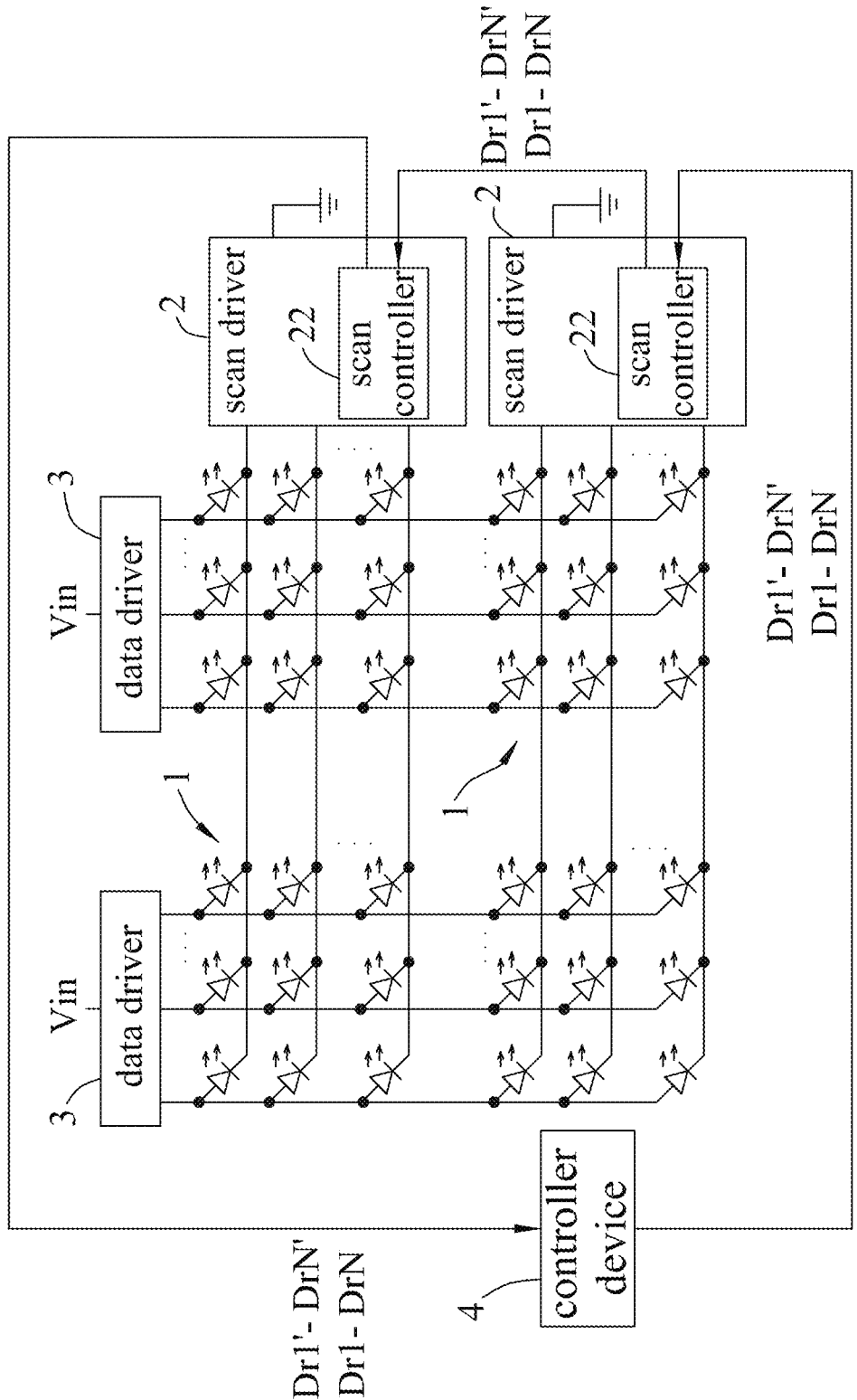

Referring to FIGS. 1, 2 and 9, a sixth embodiment of the scan-type display apparatus according to the disclosure is similar to the third embodiment as shown in FIG. 6, but differs from the third embodiment in what will be described below.

In the sixth embodiment, the data drivers 3 are not in a cascade connection. The scan controller 22 of the first one of the scan drivers 2 is connected to the controller device 4, instead of to the $S^{th}$ one of the data drivers 3. The scan controller 22 of the $R^{th}$ one of the scan drivers 2 is connected to the controller device 4, instead of to the first one of the data drivers 3. The controller device 4 receives the detection signals outputted by the scan controller 22 of the $R^{th}$ one of the scan drivers 2, and outputs the detection signals received from the scan controller 22 of the $R^{th}$ one of the scan drivers 2. The scan controller 22 of the first one of the scan drivers 2 receives the detection signals outputted by the controller device 4, generates the clamp signals (CS1-CSN) based on the detection signals that are received from the controller device 4 and that are from the detection signals generated by the scan driving circuits 21 of the first one of the scan drivers 2, and outputs the detection signals that are received from the controller device 4 and that are from the detection signals generated by the scan driving circuits 21 of the second one to the $S^{th}$ one of the scan drivers 2.

FIG. 9 depicts an example where R=S=2. In this example, the scan controller 22 of the first one of the scan drivers 2 outputs the detection signals (Dr1'-DrN') respectively received from the scan driving circuits 21 of the first one of the scan drivers 2. The scan controller 22 of the second one of the scan drivers 2 receives the detection signals (Dr1'-DrN') outputted by the scan controller 22 of the first one of the scan drivers 2, and outputs the detection signals (Dr1-DrN) respectively received from the scan driving circuits 21 of the second one of the scan drivers 2 and the detection signals (Dr1'-DrN') received from the scan controller 22 of the first one of the scan drivers 2. The controller device 4 receives the detection signals (Dr1-DrN, Dr1'-DrN') outputted by the scan controller 22 of the second one of the scan drivers 2, and outputs the detection signals (Dr1-DrN, Dr1'-DrN') received from the scan controller 22 of the second one of the scan drivers 2. The scan controller 22 of the first one of the scan drivers 2 receives the detection signals (Dr1-DrN, Dr1'-DrN') outputted by the controller device 4, generates the clamp signals (CS1-CSN) based on the detection signals (Dr1'-DrN') that are received from the controller device 4 and that are from the detection signals (Dr1'-DrN') generated by the scan driving circuits 21 of the first one of the scan drivers 2, and outputs the detection signals (Dr1-DrN) that are received from the controller device 4 and that are from the detection signals (Dr1-DrN) generated by the scan driving circuits 21 of the second one of the scan drivers 2. The scan controller 22 of the second one of the scan drivers 2 receives the detection signals (Dr1-DrN) outputted by the scan controller 22 of the first one of the scan drivers 2, and generates the clamp signals (CS1-CSN) based on the detection signals (Dr1-DrN) that are received from the scan controller 22 of the first one of the scan drivers 2 and that are from the detection signals (Dr1-DrN) generated by the scan driving circuits 21 of the second one of the scan drivers 2.

Figure 10:
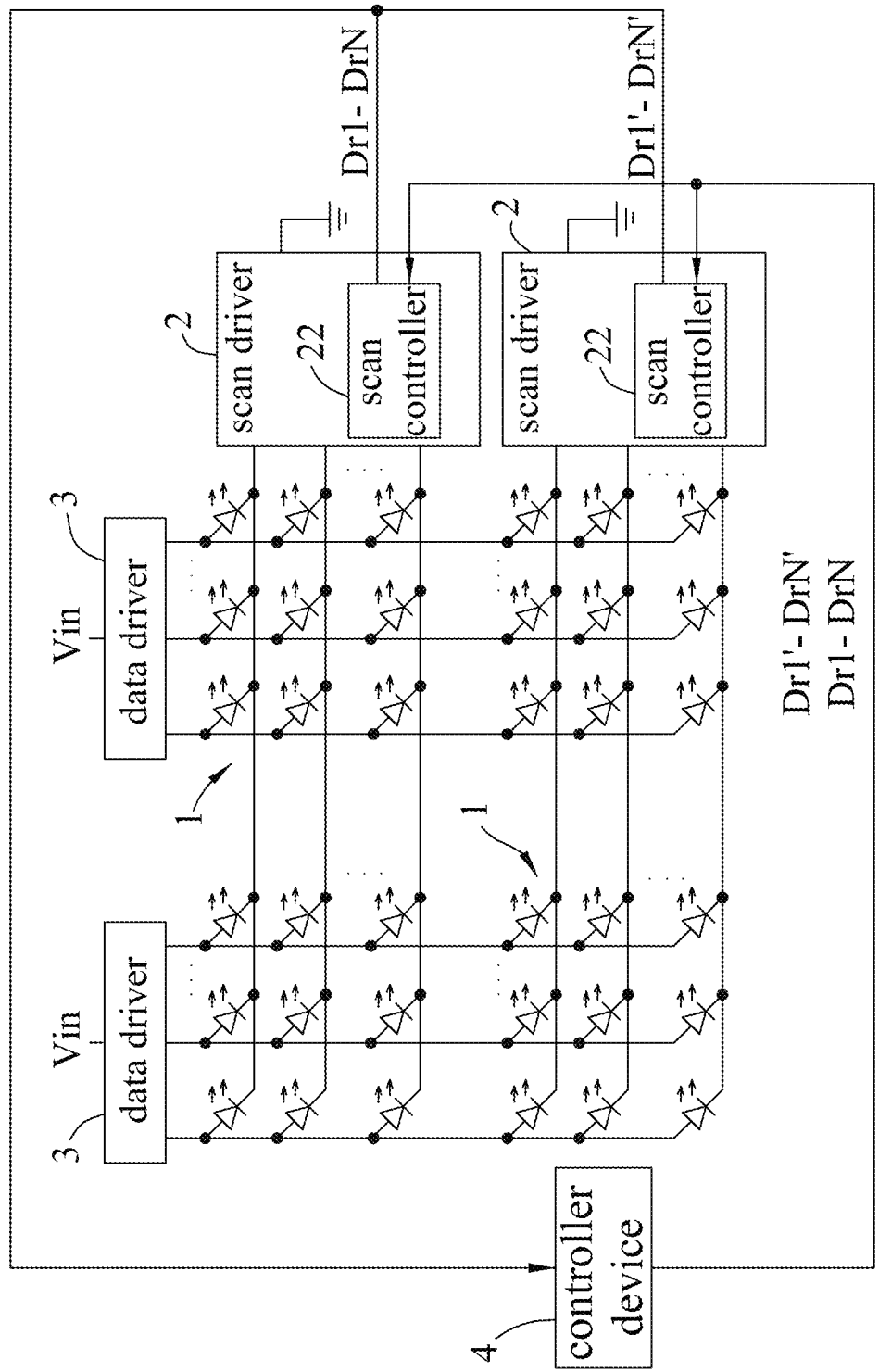

Referring to FIGS. 1, 2 and 10, a seventh embodiment of the scan-type display apparatus according to the disclosure is similar to the sixth embodiment as shown in FIG. 9, but differs from the sixth embodiment in what will be described below.

In the seventh embodiment, the scan controllers 22 of the scan drivers 2 are not in a cascade connection. The scan controller 22 of each of the scan drivers 2 is connected to the controller device 4, and outputs the detection signals respectively received from the scan driving circuits 21 of the scan driver 2. The controller device 4 receives the detection signals outputted by the scan controllers 22 of the scan drivers 2, and outputs the detection signals received from the scan controllers 22 of the scan drivers 2. The scan controller 22 of each of the scan drivers 2 receives the detection signals that are outputted by the controller device 4 and that are from the detection signals generated by the scan driving circuits 21 of the scan driver 2, and generates the clamp signals (CS1-CSN) based on the detection signals thus received.

FIG. 10 depicts an example where R=S=2. In this example, the scan controller 22 of the first one of the scan drivers 2 outputs the detection signals (Dr1'-DrN') respectively received from the scan driving circuits 21 of the first one of the scan drivers 2. The scan controller 22 of the second one of the scan drivers 2 outputs the detection signals (Dr1-DrN) respectively received from the scan driving circuits 21 of the second one of the scan drivers 2. The controller device 4 receives the detection signals (Dr1-DrN, Dr1'-DrN') outputted by the scan controllers 22 of the scan drivers 2, and outputs the detection signals (Dr1-DrN, Dr1'-DrN') received from the scan controllers 22 of the scan drivers 2. The scan controller 22 of the first one of the scan drivers 2 receives the detection signals (Dr1'-DrN') that are outputted by the controller device 4 and that are from the detection signals (Dr1'-DrN') generated by the scan driving circuits 21 of the first one of the scan drivers 2, and generates the clamp signals (CS1-CSN) based on the detection signals (Dr1'-DrN') thus received. The scan controller 22 of the second one of the scan drivers 2 receives the detection signals (Dr1-DrN) that are outputted by the controller device 4 and that are from the detection signals (Dr1-DrN) generated by the scan driving circuits 21 of the second one of the scan drivers 2, and generates the clamp signals (CS1-CSN) based on the detection signals (Dr1-DrN) thus received.

Figure 11:
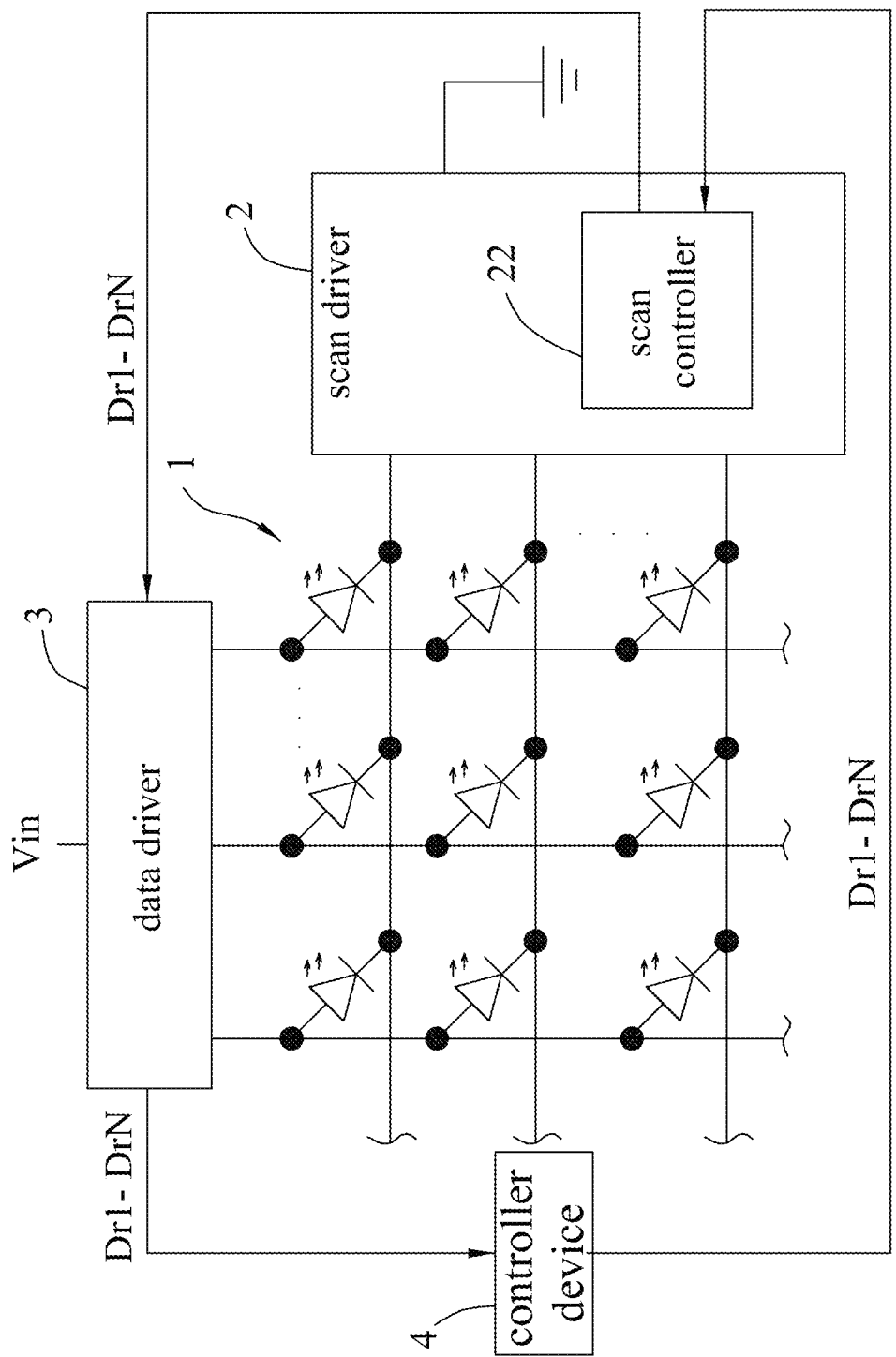

Referring to FIGS. 1, 2 and 11, an eighth embodiment of the scan-type display apparatus according to the disclosure is similar to the second embodiment as shown in FIG. 5, but differs from the second embodiment in what will be described below.

In the eighth embodiment, each of the scan controller 22 and the data driver 3 is further connected to the controller device 4. The controller device 4 receives the detection signals (Dr1-DrN) outputted by the data driver 3, and outputs the detection signals (Dr1-DrN) received from the data driver 3. The scan controller 22 receives the detection signals (Dr1-DrN) outputted by the controller device 4 instead of the data driver 3, and, with respect to each of the scan driving circuits 21, generates the clamp signal (CSj) based on the detection signal (Drj) that is received from the controller device 4 and that is from the detection signal (Drj) generated by the scan driving circuit 21.

Figure 12:
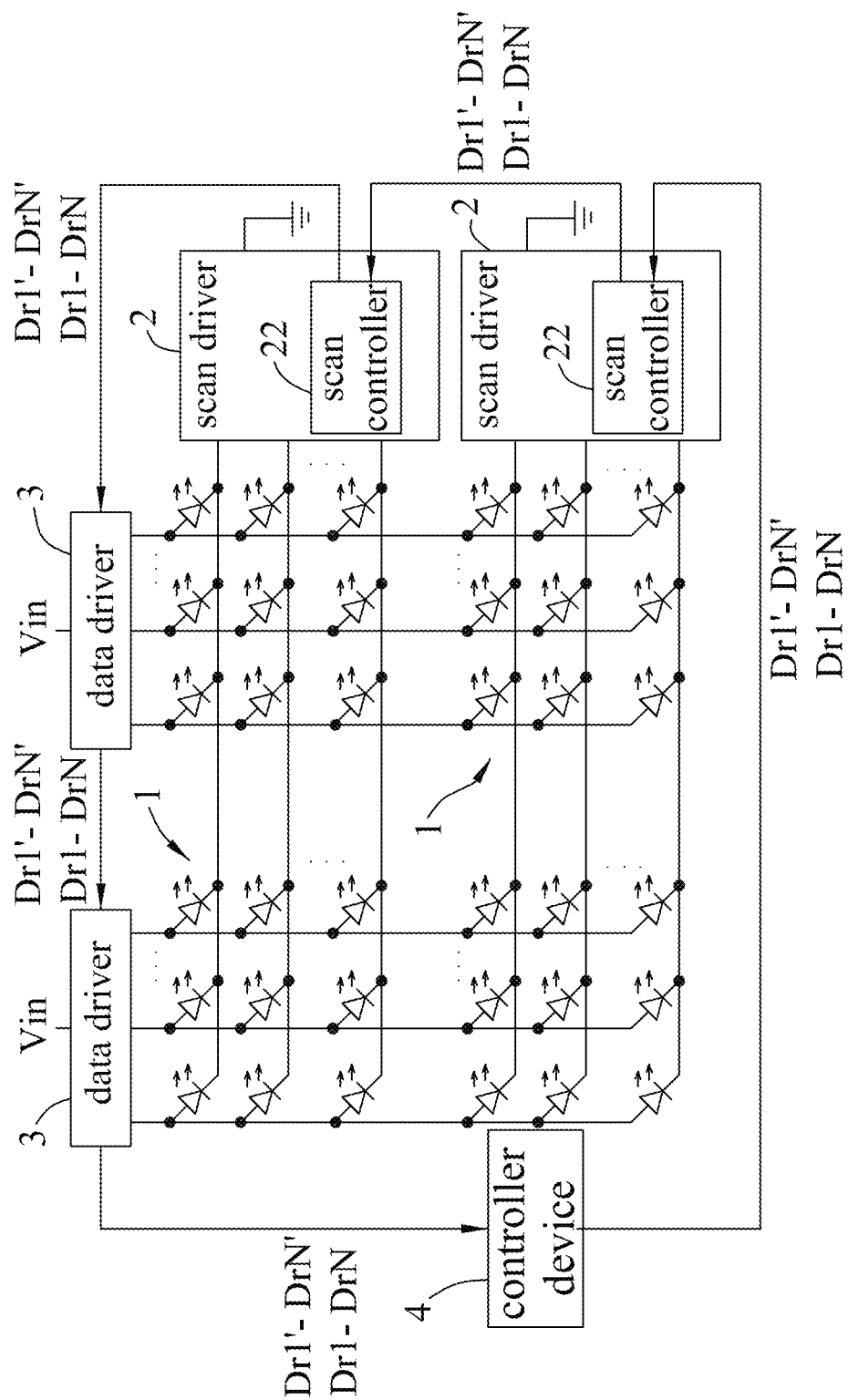

Referring to FIGS. 1, 2 and 12, a ninth embodiment of the scan-type display apparatus according to the disclosure is similar to the third embodiment as shown in FIG. 6, but differs from the third embodiment in what will be described below.

In the ninth embodiment, the controller device 4 is connected between the scan controller 22 of the first one of the scan drivers 2 and the $S^{th}$ one of the data drivers 3. The controller device 4 receives the detection signals outputted by the $S^{th}$ one of the data drivers 3, and outputs the detection signals received from the $S^{th}$ one of the data drivers 3. The scan controller 22 of the first one of the scan drivers 2 receives the detection signals outputted by the controller device 4 instead of the $S^{th}$ one of the data drivers 3, generates the clamp signals (CS1-CSN) based on the detection signals that are received from the controller device 4 and that are from the detection signals generated by the scan driving circuits 21 of the first one of the scan drivers 2, and outputs the detection signals that are received from the controller device 4 and that are from the detection signals generated by the scan driving circuits 21 of the second one to the $R^{th}$ one of the scan drivers 2.

FIG. 12 depicts an example where R=S=2. In this example, the scan controller 22 of the first one of the scan drivers 2 outputs the detection signals (Dr1'-DrN') respectively received from the scan driving circuits 21 of the first one of the scan drivers 2. The scan controller 22 of the second one of the scan drivers 2 receives the detection signals (Dr1'-DrN') outputted by the scan controller 22 of the first one of the scan drivers 2, and outputs the detection signals (Dr1-DrN) respectively received from the scan driving circuits 21 of the second one of the scan drivers 2 and the detection signals (Dr1'-DrN') received from the scan controller 22 of the first one of the scan drivers 2. The first one of the data drivers 3 receives the detection signals (Dr1-DrN, Dr1'-DrN') outputted by the scan controller 22 of the second one of the scan drivers 2, and outputs the detection signals (Dr1-DrN, Dr1'-DrN') received from the scan controller 22 of the second one of the scan drivers 2. The second one of the data drivers 3 receives the detection signals (Dr1-DrN, Dr1'-DrN') outputted by the first one of the data drivers 3, and outputs the detection signals (Dr1-DrN, Dr1'-DrN') received from the first one of the data drivers 3. The controller device 4 receives the detection signals (Dr1-DrN, Dr1'-DrN') outputted by the second one of the data drivers 3, and outputs the detection signals (Dr1-DrN, Dr1'-DrN') received from the second one of the data drivers 3. The scan controller 22 of the first one of the scan drivers 2 receives the detection signals (Dr1-DrN, Dr1'-DrN') outputted by the controller device 4, generates the clamp signals (CS1-CSN) based on the detection signals (Dr1'-DrN') that are received from the controller device 4 and that are from the detection signals (Dr1'-DrN') generated by the scan driving circuits 21 of the first one of the scan drivers 2, and outputs the detection signals (Dr1-DrN) that are received from the controller device 4 and that are from the detection signals (Dr1-DrN) generated by the scan driving circuits 21 of the second one of the scan drivers 2. The scan controller 22 of the second one of the scan drivers 2 receives the detection signals (Dr1-DrN) outputted by the scan controller 22 of the first one of the scan drivers 2, and generates the clamp signals (CS1-CSN) based on the detection signals (Dr1-DrN) that are received from the scan controller 22 of the first one of the scan drivers 2 and that are from the detection signals (Dr1-DrN) generated by the scan driving circuits 21 of the second one of the scan drivers 2.

Figure 13:
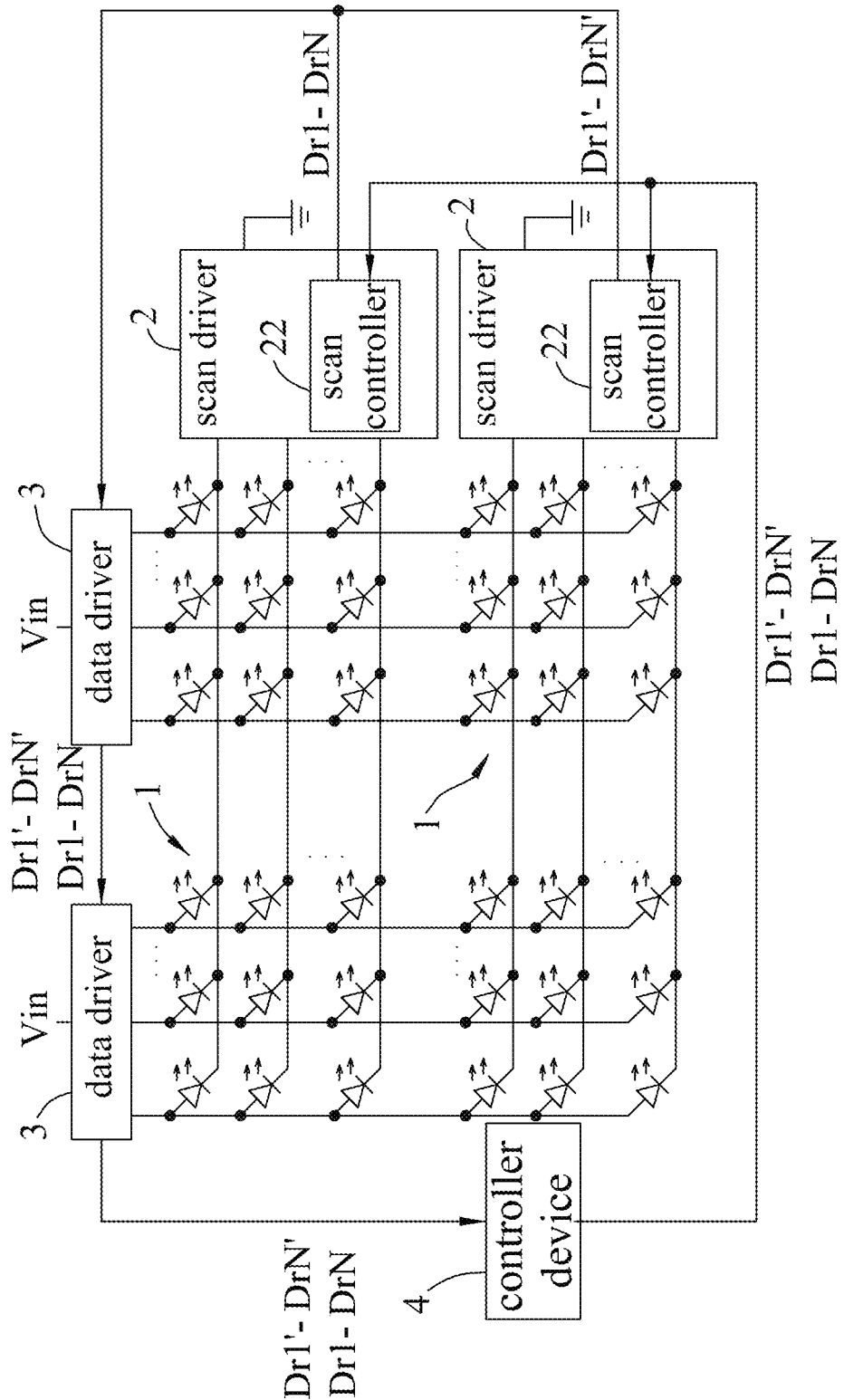

Referring to FIGS. 1, 2 and 13, a tenth embodiment of the scan-type display apparatus according to the disclosure is similar to the ninth embodiment as shown in FIG. 12, but differs from the ninth embodiment in what will be described below.

In the tenth embodiment, the scan controllers 22 of the scan drivers 2 are not in a cascade connection. The scan controller 22 of each of the scan drivers 2 is connected to the first one of the data drivers 3 and the controller device 4, and outputs the detection signals respectively received from the scan driving circuits 21 of the scan driver 2. The first one of the data drivers 3 receives the detection signals outputted by the scan controllers 22 of the scan drivers 2, and outputs the detection signals received from the scan controllers 22 of the scan drivers 2. The $s^{th}$ one of the data drivers 3 receives the detection signals outputted by the $(s-1)^{th}$ one of the data drivers 3, and outputs the detection signals received from the $(s-1)^{th}$ one of the data drivers 3, where 2≤s≤S. The controller device 4 receives the detection signals outputted by the $S^{th}$ one of the data drivers 3, and outputs the detection signals received from the $S^{th}$ one of the data drivers 3. The scan controller 22 of each of the scan drivers 2 receives the detection signals that are outputted by the controller device 4 and that are from the detection signals generated by the scan driving circuits 21 of the scan driver 2, and generates the clamp signals (CS1-CSN) based on the detection signals thus received.

FIG. 13 depicts an example where R=S=2. In this example, the scan controller 22 of the first one of the scan drivers 2 outputs the detection signals (Dr1'-DrN') respectively received from the scan driving circuits 21 of the first one of the scan drivers 2. The scan controller 22 of the second one of the scan drivers 2 outputs the detection signals (Dr1-DrN) respectively received from the scan driving circuits 21 of the second one of the scan drivers 2. The first one of the data drivers 3 receives the detection signals (Dr1-DrN, Dr1'-DrN') outputted by the scan controllers 22 of the scan drivers 2, and outputs the detection signals (Dr1-DrN, Dr1'-DrN') received from the scan controllers 22 of the scan drivers 2. The second one of the data drivers 3 receives the detection signals (Dr1-DrN, Dr1'-DrN') outputted by the first one of the data drivers 3, and outputs the detection signals (Dr1-DrN, Dr1'-DrN') received from the first one of the data drivers 3. The controller device 4 receives the detection signals (Dr1-DrN, Dr1'-DrN') outputted by the second one of the data drivers 3, and outputs the detection signals (Dr1-DrN, Dr1'-DrN') received from the second one of the data drivers 3. The scan controller 22 of the first one of the scan drivers 2 receives the detection signals (Dr1'-DrN') that are outputted by the controller device 4 and that are from the detection signals (Dr1'-DrN') generated by the scan driving circuits 21 of the first one of the scan drivers 2, and generates the clamp signals (CS1-CSN) based on the detection signals (Dr1'-DrN') thus received. The scan controller 22 of the second one of the scan drivers 2 receives the detection signals (Dr1-DrN) that are outputted by the controller device 4 and that are from the detection signals (Dr1-DrN) generated by the scan driving circuits 21 of the second one of the scan drivers 2, and generates the clamp signals (CS1-CSN) based on the detection signals (Dr1-DrN) thus received.

Figure 14:
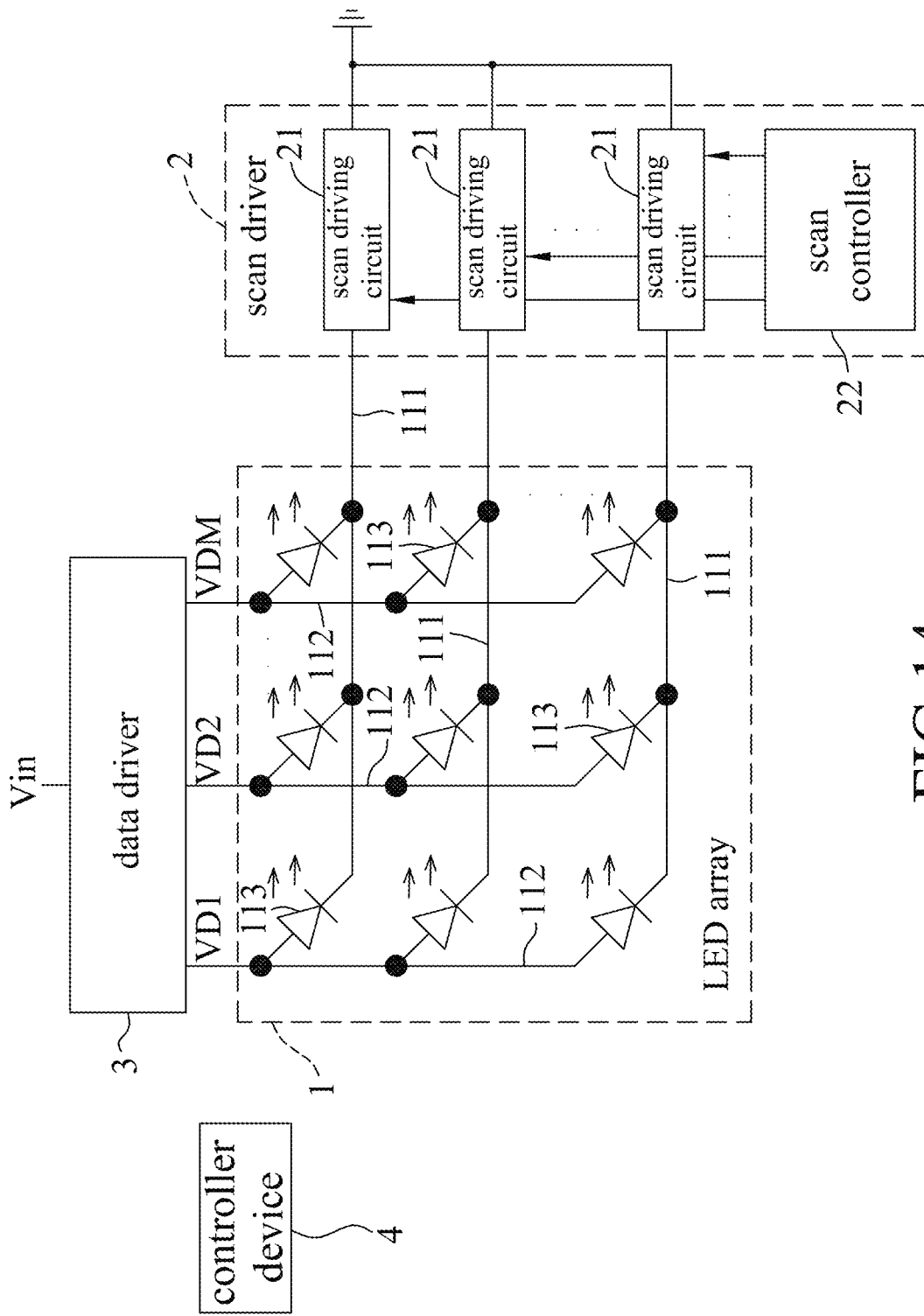
Figure 15:
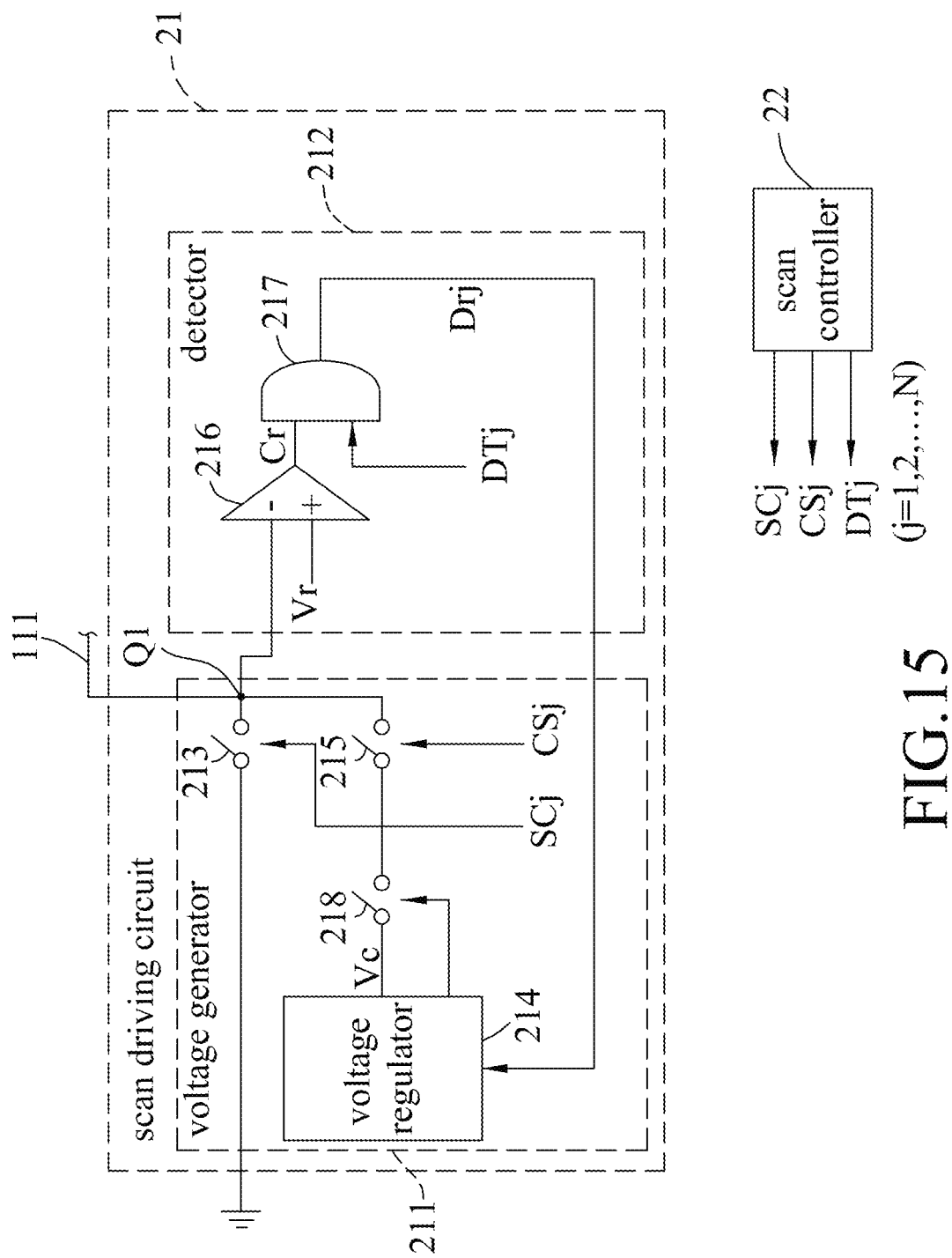
FIG. 15 is a circuit block diagram illustrating a scan driving circuit of the eleventh embodiment.

Referring to FIGS. 14 and 15, an eleventh embodiment of the scan-type display apparatus according to the disclosure is similar to the first embodiment as shown in FIGS. 1 and 2, but differs from the first embodiment in what will be described below.

In the eleventh embodiment, with respect to each of the scan driving circuits 21, the scan controller 22 is not connected to the output terminal of the logic gate 217, and does not receive the detection signal (Drj). The clamp signal (CSj) is independent of the detection signal (Drj). The voltage regulator 214 is further connected to the output terminal of the logic gate 217 to receive the detection signal (Drj), and generates a control signal based on the detection signal (Drj). The voltage generator 211 further includes an intermediate switch 218 that is connected between the voltage regulator 214 and the first terminal of the clamp switch 215. The intermediate switch 218 has a first terminal that is connected to the voltage regulator 214 to receive the clamp voltage (Vc), a second terminal that is connected to the first terminal of the clamp switch 215, and a control terminal that is connected to the voltage regulator 214 to receive the control signal. The intermediate switch 218 transitions between conduction and non-conduction based on the control signal, and, when conducting, permits transmission of the clamp voltage (Vc) therethrough to the first terminal of the clamp switch 215.

Figure 16:
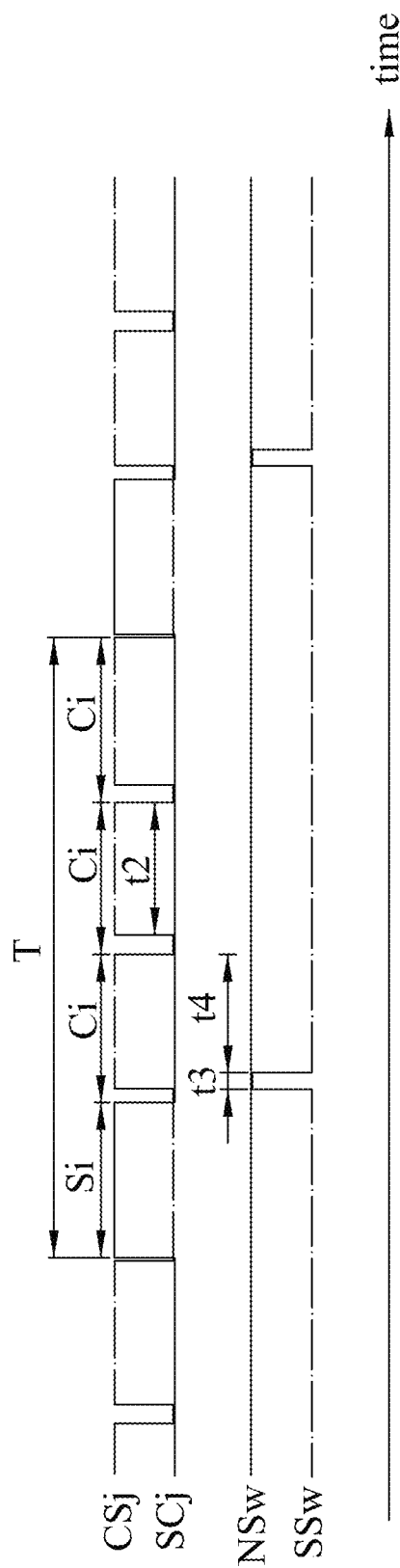
FIG. 16 is a timing diagram illustrating operations of the eleventh embodiment.

In this embodiment, with respect to each of the scan driving circuits 21, regardless of whether the detection signal (Drj) indicates that none of the LEDs 113 connected to the corresponding scan line 111 is short circuited or at least one is short circuited, the clamp signal (CSj) will have a waveform as shown in FIG. 3. As shown in FIG. 16, when the detection signal (Drj) indicates that none of the LEDs 113 connected to the corresponding scan line 111 is short circuited, the control signal has a waveform (NSw), and is at a voltage level (e.g., a logic "1" voltage level) corresponding to conduction of the intermediate switch 218. When the detection signal (Drj) indicates that at least one of the LEDs 113 connected to the corresponding scan line 111 is short circuited, the control signal has a waveform (SSw), is at the voltage level corresponding to conduction of the intermediate switch 218 during the first clamp time slice (t3) of the second clamp time segment (t2) of the first one of the clamp time intervals (Ci), and is at a voltage level corresponding to non-conduction of the intermediate switch 218 during other times of the operation cycle (T)).

In the eleventh embodiment, with respect to each of the scan driving circuits 21, the voltage generator 211 outputs the common voltage at the output terminal (Q1) thereof during the scan time interval (Si), outputs the clamp voltage (Vc) at the output terminal (Q1) thereof during the second clamp time segments (t2) of the clamp time intervals (Ci) when the detection signal (Drj) indicates that none of the LEDs 113 connected to the corresponding scan line 111 is short circuited, and outputs the clamp voltage (Vc) at the output terminal (Q1) thereof during the first clamp time slice (t3) of the second clamp time segment (t2) of the first one of the clamp time intervals (Ci) when the detection signal (Drj) indicates that at least one of the LEDs 113 connected to the corresponding scan line 111 is short circuited. Therefore, the scan-type display apparatus of the eleventh embodiment can eliminate short circuit caterpillar phenomenon of the LED array 1 as does the scan-type display apparatus of the first embodiment.

In view of the above, for each of the first to eleventh embodiments, the scan-type display apparatus can eliminate short circuit caterpillar phenomenon of the LED array 1. In addition, for each of the second to tenth embodiments, the scan controller(s) 22 of the scan driver(s) 2 output(s) the detection signals (Dr1-DrN and/or Dr1'-DrN') generated by the scan driving circuits 21 of the scan driver(s) 2 for receipt by the data driver(s) 3 and/or the controller device 4, so as to inform the data driver(s) 3 and/or the controller device 4 whether any one of the LEDs 113 connected to any one of the scan lines 111 is short circuited.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:
1. A scan-type display apparatus comprising:
 a light emitting diode (LED) array having a common cathode configuration, and including
  a plurality of scan lines,
  a plurality of data lines, and
  a plurality of LEDs arranged in a matrix that has a plurality of rows respectively corresponding to said scan lines and a plurality of columns respectively corresponding to said data lines, with respect to each of said rows, cathodes of said LEDs in said row being connected to said scan line that corresponds to said row, with respect to each of said columns, anodes of said LEDs in said column being connected to said data line that corresponds to said column; and a scan driver including a plurality of scan driving circuits that respectively correspond to said scan lines, each of said scan driving circuits including a voltage generator having an output terminal that is connected to said scan line corresponding to said scan driving circuit, and configured to output one of a common voltage and a clamp voltage at said output terminal of said voltage generator, and a detector connected to said output terminal of said voltage generator to receive a voltage at said output terminal of said voltage generator, further receiving a detection timing signal, and generating a detection signal that indicates whether any one of said LEDs connected to said scan line corresponding to said scan driving circuit is short circuited based on the voltage at said output terminal of said voltage generator and the detection timing signal;

wherein, with respect to each of said scan driving circuits, said voltage generator includes a scan switch having a first terminal that receives the common voltage, a second terminal that is connected to said output terminal of said voltage generator, and a control terminal that receives a scan signal, a voltage regulator generating the clamp voltage, and a clamp switch having a first terminal that is connected to said voltage regulator to receive the clamp voltage, a second terminal that is connected to said output terminal of said voltage generator, and a control terminal that receives a clamp signal; and wherein, with respect to each of said scan driving circuits, said voltage regulator is further connected to said detector to receive the detection signal, and generates a control signal based on the detection signal, said voltage generator further includes an intermediate switch that is connected between said voltage regulator and said first terminal of said clamp switch, and said intermediate switch has a first terminal that is connected to said voltage regulator to receive the clamp voltage, a second terminal that is connected to said first terminal of said clamp switch, and a control terminal that is connected to said voltage regulator to receive the control signal.

2. The scan-type display apparatus of claim 1, wherein, with respect to each of said scan driving circuits, said detector includes:

a comparator having a first input terminal that is connected to said output terminal of said voltage generator to receive the voltage at said output terminal of said voltage generator, a second input terminal that receives a predetermined reference voltage, and an output terminal that provides a comparison signal; and a logic gate having a first input terminal that is connected to said output terminal of said comparator to receive the comparison signal, a second input terminal that receives the detection timing signal, and an output terminal that provides the detection signal.

3. The scan-type display apparatus of claim 1, wherein said scan driver further includes a scan controller; and with respect to each of said scan driving circuits, said scan controller is connected to said detector, said control terminal of said scan switch and said control terminal of said clamp switch, and generates the detection timing signal to be received by said detector, the scan signal to be received by said control terminal of said scan switch, and the clamp signal to be received by said control terminal of said clamp switch.

4. The scan-type display apparatus of claim 1, wherein, with respect to each of said scan driving circuits, said scan driving circuit has an operation cycle that includes a scan time interval and a number (N−1) of clamp time intervals, where N is a total number of said scan driving circuits, each of the clamp time intervals includes a first clamp time segment and a second clamp time segment, the scan signal is at a voltage level corresponding to conduction of said scan switch during the scan time interval, and is at a voltage level corresponding to non-conduction of said scan switch during the clamp time intervals, the clamp signal is at a voltage level corresponding to non-conduction of said clamp switch during the scan time interval and the first clamp time segments of the clamp time intervals, and is at a voltage level corresponding to conduction of said clamp switch during the second clamp time segments of the clamp time intervals, the detection timing signal is at a voltage level that corresponds to a state where said detector detects whether any one of said LEDs connected to said scan line corresponding to said scan driving circuit is short circuited during the first clamp time segments of a second one to an $(N-1)^{th}$ one of the clamp time intervals, and is at a voltage level that corresponds to a state where said detector does not perform detection during other times of the operation cycle, and when the detection signal indicates that none of said LEDs connected to said scan line corresponding to said scan driving circuit is short circuited, the control signal is at a voltage level corresponding to conduction of said intermediate switch.

5. The scan-type display apparatus of claim 4, wherein, with respect to each of said scan driving circuits, the second clamp time segment of each of the clamp time intervals includes a first clamp time slice and a second clamp time slice, and when the detection signal indicates that at least one of said LEDs connected to said scan line corresponding to said scan driving circuit is short circuited, the control signal is at the voltage level corresponding to conduction of said intermediate switch during the first clamp time slice of the second clamp time segment of a first one of the clamp time intervals, and is at a voltage level corresponding to non-conduction of said intermediate switch during other times of the operation cycle.

6. A scan driver adapted to be used in a scan-type display apparatus that includes a light emitting diode (LED) array, the LED array having a common cathode configuration, and including a plurality of scan lines and a plurality of LEDs, each of the LEDs being connected to a corresponding one of the scan lines, said scan driver comprising a plurality of scan driving circuits that respectively correspond to the scan lines, each of said scan driving circuits including:

a voltage generator having an output terminal that is connected to the scan line corresponding to said scan driving circuit, and configured to output one of a common voltage and a clamp voltage at said output terminal of said voltage generator; and a detector connected to said output terminal of said voltage generator to receive a voltage at said output terminal of said voltage generator, further receiving a detection timing signal, and generating a detection signal that indicates whether any one of the LEDs connected to the scan line corresponding to said scan driving circuit is short circuited based on the voltage at said output terminal of said voltage generator and the detection timing signal;

wherein, with respect to each of said scan driving circuits, said voltage generator includes
- a scan switch having a first terminal that receives the common voltage, a second terminal that is connected to said output terminal of said voltage generator, and a control terminal that receives a scan signal,
- a voltage regulator generating the clamp voltage, and
- a clamp switch having a first terminal that is connected to said voltage regulator to receive the clamp voltage, a second terminal that is connected to said output terminal of said voltage generator, and a control terminal that receives a clamp signal;

wherein, with respect to each of said scan driving circuits, said voltage regulator is further connected to said detector to receive the detection signal, and generates a control signal based on the detection signal, said voltage generator further includes an intermediate switch that is connected between said voltage regulator and said first terminal of said clamp switch, and said intermediate switch has a first terminal that is connected to said voltage regulator to receive the clamp voltage, a second terminal that is connected to said first terminal of said clamp switch, and a control terminal that is connected to said voltage regulator to receive the control signal.

7. The scan driver of claim 6, wherein, with respect to each of said scan driving circuits, said detector includes:
- a comparator having a first input terminal that is connected to said output terminal of said voltage generator to receive the voltage at said output terminal of said voltage generator, a second input terminal that receives a predetermined reference voltage, and an output terminal that provides a comparison signal; and
- a logic gate having a first input terminal that is connected to said output terminal of said comparator to receive the comparison signal, a second input terminal that receives the detection timing signal, and an output terminal that provides the detection signal.

* * * * *